(12) United States Patent
Tsuda

(10) Patent No.: US 8,207,800 B2
(45) Date of Patent: Jun. 26, 2012

(54) ELASTIC WAVE FILTER INCLUDING A GRATING REFLECTOR BETWEEN TAPERED INPUT AND OUTPUT IDT ELECTRODES

(75) Inventor: Tadaaki Tsuda, Sayama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 341 days.

(21) Appl. No.: 12/587,818

(22) Filed: Oct. 14, 2009

(65) Prior Publication Data

US 2010/0102901 A1  Apr. 29, 2010

(30) Foreign Application Priority Data

Oct. 24, 2008  (JP) .................... 2008-274660

(51) Int. Cl.
*H03H 9/64* (2006.01)
(52) U.S. Cl. ..................... 333/195; 310/313 D
(58) Field of Classification Search .......... 333/193–196; 310/313 R, 313 B, 313 C, 313 D
See application file for complete search history.

(56) References Cited

U.S. PATENT DOCUMENTS

| 4,746,882 | A * | 5/1988 | Solie .............................. | 333/196 |
| 4,878,036 | A * | 10/1989 | Yatsuda et al. ................ | 333/195 |
| 5,289,073 | A * | 2/1994 | Mariani ..................... | 310/313 D |
| 6,023,122 | A | 2/2000 | Liu et al. | |
| 7,023,300 | B2 * | 4/2006 | Jian et al. ...................... | 333/195 |
| 7,764,144 | B2 * | 7/2010 | Tsuda ............................ | 333/195 |
| 2009/0085692 | A1 * | 4/2009 | Tsuda ............................ | 333/193 |

FOREIGN PATENT DOCUMENTS

| JP | 61-202511 | 9/1986 |
| JP | 61-289714 | 12/1986 |
| JP | 8-335848 | 12/1996 |

OTHER PUBLICATIONS

Solie L: "Tapered Transducers-Design and Applications" 1998 IEEE Ultrasonics Symposium Proceedings, Oct. 5, 1998, Oct. 8, 1998 pp. 27-37, XP000887991 * abstract; sections I, II: figures 2, 3, 6.

* cited by examiner

*Primary Examiner* — Barbara Summons
(74) *Attorney, Agent, or Firm* — Jordan and Hamburg LLP

(57) ABSTRACT

To provide an elastic wave filter capable of obtaining steep attenuation at a high band side or a low band side in a pass band and having high selectivity. An elastic wave filter is configured in a manner that when seen in a propagation direction of an elastic wave, as for respective electrode fingers composing each group of electrode fingers in an input side tapered IDT electrode and an output side tapered IDT electrode, width dimensions thereof are the same one another, and a distance dimension between the adjacent electrode fingers is formed to be the same as the width dimension of the electrode finger, when seen in the propagation direction of an elastic wave, as for a group of electrode fingers in a grating reflector, width dimensions of respective electrode fingers composing the group of the electrode fingers are the same, and a distance dimension between the adjacent electrode fingers is formed to be the same as the width dimension, and the width dimension of the electrode finger and the distance dimension between the electrode fingers are set to be equal to or less than a minimum value or equal to or more than a maximum value of the width dimension of the electrode finger and the distance dimension between the electrode fingers in the input side tapered IDT electrode and the output side tapered IDT electrode.

6 Claims, 18 Drawing Sheets a: CORRESPOND TO MAXIMUM VALUE OF $\lambda$idt
b: CORRESPOND TO MINIMUM VALUE OF $\lambda$idt
c: CORRESPOND TO $\lambda$gr a: CORRESPOND TO MAXIMUM VALUE OF $\lambda_{idt}$
b: CORRESPOND TO MINIMUM VALUE OF $\lambda_{idt}$
c: CORRESPOND TO $\lambda_{gr}$ a: CORRESPOND TO MAXIMUM VALUE OF $\lambda_{idt}$
b: CORRESPOND TO MINIMUM VALUE OF $\lambda_{idt}$
d: CORRESPOND TO MAXIMUM VALUE OF $\lambda_{gr}$
e: CORRESPOND TO MINIMUM VALUE OF $\lambda_{gr}$ Fig. 17
(a)
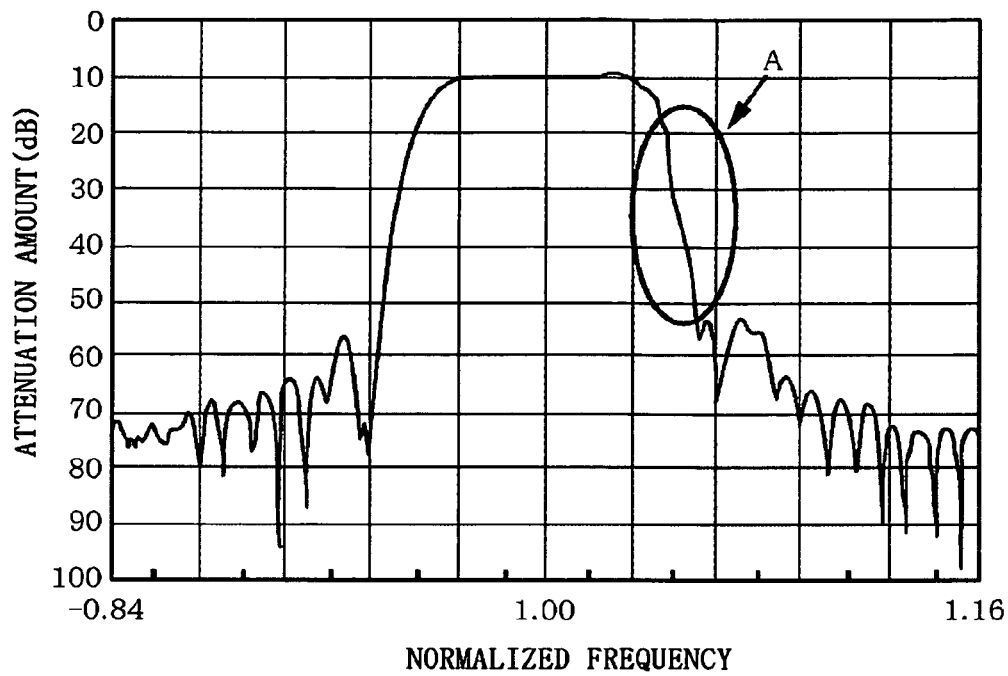
(b)
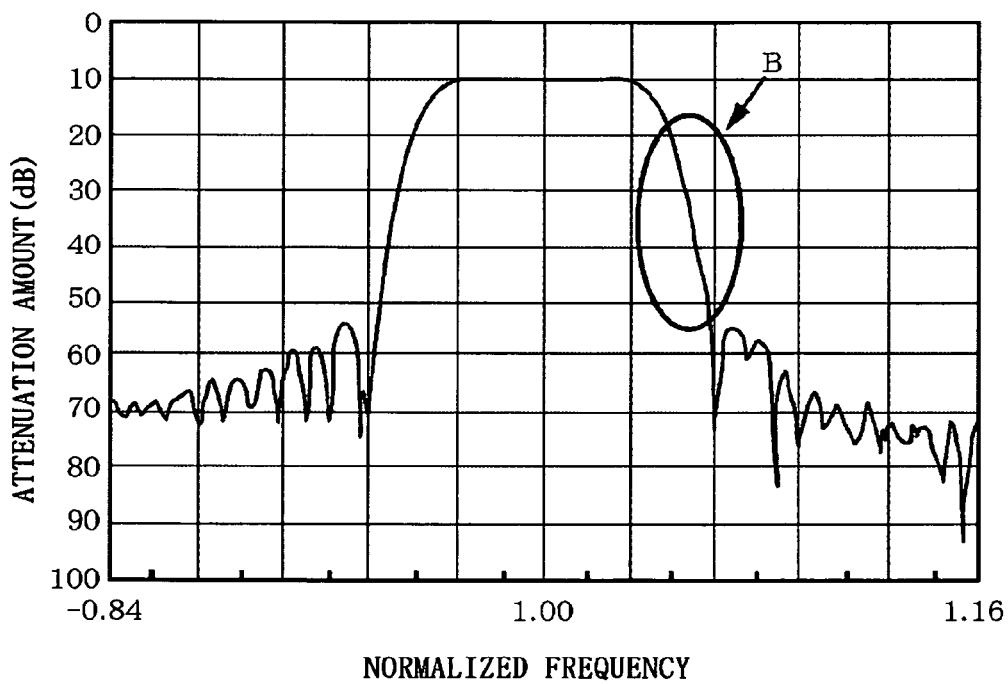

ELASTIC WAVE FILTER INCLUDING A GRATING REFLECTOR BETWEEN TAPERED INPUT AND OUTPUT IDT ELECTRODES

BACKGROUND OF THE INVENTION

1. Field of the Invention

The present invention relates to an elastic wave filter, for example, an (SAW: Surface Acoustic Wave) filter.

2. Description of the Related Art

A SAW device makes good use of surface acoustic waves and by disposing electrode fingers called an IDT (interdigital transducer) on a piezoelectric substrate, and performing an electromechanical interconversion between an electrical signal and an elastic wave, to have frequency selection (band filter) characteristics. The SAW filter, one of the SAW devices, is used as a band pass filter for various communication devices such as a cellular phone, in which sophistication in performance and miniaturization have been proceeding. In recent years, with advances in speeding up and enlarging capacity of wireless data communication, demands for a smaller insertion loss (attenuation of output power to input power), excellent filter characteristics in frequency selectivity, a wider band width, flatness, and miniaturization have been growing. In order to satisfy these demands, it is advantageous to use, for example, a tapered IDT filter.

FIG. 18 shows a filter 100 being a tapered IDT filter having a general configuration. The filter 100 is provided with an input side tapered IDT electrode 102 and an output side tapered IDT electrode 103, which are tapered electrodes formed on a piezoelectric substrate 101, and is configured so that elastic waves propagate from an input side tapered IDT electrode 102 side toward an output side tapered IDT electrode 103 side. A shield 104 to suppress coupling between the electrodes 102 and 103 is provided between these electrodes 102 and 103, and the shield 104 is formed as a square-shaped planar metal film (what is called a solid film). Note that the tapered IDT electrode is sometimes called an inclined interdigital electrode, a SFIT, a slanted electrode, or the like.

The electrodes 102 and 103 each are composed of two parallel bus bars 105 having a plurality of electrode fingers 106, in the respective electrodes 102 and 103, the electrode fingers 106 connected to the bus bars 105 are faced, and further, for example, two of the electrode fingers 106 are paired, and the pairs extend alternately therefrom to be a comb shape, thereby being configured as a SPLIT electrode.

In each of the electrodes 102 and 103, the electrode fingers 106 are formed so that width dimensions of the electrode fingers 106 become constant and distance dimensions between the electrode fingers 106, 106 also become constant in a propagation direction of an elastic wave. An arrangement pattern composed of widths of the electrode finger 106 and distances between the electrode fingers 106, 106 is designed so that a cycle unit λidt having a certain length is repeated. In this example, the single cycle unit λidt is constituted by the four electrode fingers 106 and distance regions between the electrode fingers 106. In this filter 100, an elastic wave having a wavelength the same as the cycle unit λidt in length propagates from the input side tapered IDT electrode 102 toward the output side tapered IDT electrode 103. From the bus bar 105 on one side toward the bus bar 105 on the other side in a direction perpendicular to the propagation direction of an elastic wave, the length of the cycle unit λidt is designed in a manner that it is gradually widened, in other words, the width of the electrode finger 106 and the distance between the electrode fingers 106, 106 are gradually widened respectively. Note that the configuration of the IDT electrode will be described in detail in embodiments, and therefore, it is not described particularly here and the drawing is also shown in a simplified manner for convenience sake, and the width of the electrode finger 106 and the width between the electrode fingers 106, 106 are shown in a constant manner.

By configuring the tapered IDT by gradually widening the arrangement pattern of the electrode fingers 106 in the manner described above, elastic waves ranging from a high frequency corresponding to a region where the cycle unit λidt is narrow to a low frequency corresponding to a region where the cycle unit λidt is wide propagate in the filter 100. By applying the above configuration, widening a band of the filter 100 is achieved.

By the way, an appearance of an SAW filter more excellent in selectivity has been expected strongly, and there have been considered various methods achieving steepness of a filter characteristic in a frequency region from a pass band to a stop band. In the above SAW filter 100 particularly, there exists a problem that an attenuation characteristic at a high frequency side (high band side) deteriorates compared with that at a low frequency side (low band side), and therefore, improvement thereof has been required.

The cause of the above-described deterioration of the attenuation characteristic will be explained briefly. When a propagation path where the cycle unit λidt corresponding to a wavelength of an elastic wave is formed is called a track, the same excitation factor exists in the tracks from a low frequency to a high frequency, which form the pass band, in regions where the electrode fingers 106 are formed in the IDT electrodes 102 and 103 in the SAW filter 100. That is, propagation states (propagation velocities) of elastic waves are the same in the regions where the electrode fingers 106 are formed. However, difference in the propagation state is generated between a region where the electrode fingers 106 are not formed and the region where they are formed, and therefore, as shown by L0 in the drawing, for example, when an elastic wave passing through a predetermined track in the input side tapered IDT electrode 102 is radiated from an end edge of the input side tapered IDT electrode 102 on the output side tapered IDT electrode 103 side to the output side tapered IDT electrode 103, the above elastic wave is refracted and is not incident on a corresponding track in the output side tapered IDT electrode 103, resulting that energy loss is caused. Due to the energy loss, the deterioration of the attenuation characteristic is caused at both the high band side and the low band side.

Then, the cycle unit λidt of a track where a high frequency is propagated is formed smaller than that of a track where a low frequency is propagated. Thus in the case of seeing propagation distances L between the input side IDT electrode 102 and the output side IDT electrode 103 respectively from an elastic wave passing through an elastic wave propagation region Tr1 where λidt is constituted narrowly at the high frequency side and an elastic wave passing through an elastic wave propagation region Tr2 where λidt is constituted widely at the low frequency side, which are shown in the drawing, for example, the propagation distance L becomes longer when seen from the elastic wave passing through Tr1. When the propagation distance L becomes long as described above, the energy loss caused by the refraction is likely to occur.

Further, the elastic wave radiated from an end portion of the input side tapered IDT electrode 102 is diffracted, and therefore, loss based on the diffraction is caused in energy propagation between the input side tapered IDT electrode 102 and the output side tapered IDT electrode 103, and the longer the propagation distance L is, the more the diffraction loss is increased. Due to these reasons, the deterioration of the attenuation characteristic at the high band side becomes larger than that at the low band side.

By the way, Patent Document 1 discloses an SAW filter configured so that a grating structure reflecting an SAW having a predetermined frequency is disposed between a tapered input side IDT electrode and a tapered output side IDT electrode at predetermined distances and a frequency stop band is formed in a pass band, in other words, a notch filter characteristic is obtained. Further, Patent Document 2 discloses that a grating reflector is provided between an input side IDT and an output side IDT to match a reflection band width of the reflector with a frequency band where a spurious signal is generated thereby suppressing a spurious signal. However, Patent Document 1 and Patent Document 2 do not disclose the above-described problems, and accordingly, these problems cannot be solved.

[Patent Document 1] Japanese Patent Application Laid-open No. Sho 61-289714 (FIG. 4, FIG. 5, and so on)
[Patent Document 2] Japanese Patent Application Laid-open No. Hei 8-335848 (FIG. 1, paragraph 0027, and so on)

SUMMARY OF THE INVENTION

The present invention is made in view of such circumstances, and an object thereof is to provide an elastic wave filter capable of obtaining steep attenuation at a high band side or a low band side in a pass band and having high selectivity.

An elastic wave filter of the present invention is characterized in that it includes: an input side tapered IDT electrode including a pair of bus bars formed to be parallel to each other on a piezoelectric substrate and a group of electrode fingers formed in a comb shape by extending the electrode fingers alternately from each of the paired bus bars respectively, and formed in a manner that a width of the electrode finger and a distance between the electrode fingers are widened from the bus bar on one side toward the bus bar on the other side;

an output side tapered IDT electrode including a pair of bus bars provided on the piezoelectric substrate to extend in an extending direction of the bus bars in the input side tapered IDT electrode and to be apart from the input side tapered IDT electrode in a propagation direction of an elastic wave and a group of electrode fingers formed in a comb shape by extending the electrode fingers alternately from each of the paired bus bars respectively, and formed in a manner that a width of the electrode finger and a distance between the electrode fingers are widened from the bus bar on one side toward the bus bar on the other side; and a grating reflector including a group of electrode fingers, which are arranged between the input side tapered IDT electrode and the output side tapered IDT electrode along the propagation direction of an elastic wave and each of which extends perpendicularly to the propagation direction, and in which when seen in the propagation direction of an elastic wave, the respective electrode fingers composing the groups of electrode fingers in the input side tapered IDT electrode and the output side tapered IDT electrode are formed in a manner that width dimensions thereof are the same one another, and a distance dimension between the adjacent electrode fingers is the same as the width dimension of the electrode finger, and when seen in the propagation direction of an elastic wave, the group of electrode fingers in the grating reflector is formed in a manner that width dimensions of the respective electrode fingers composing the group of electrode fingers are the same, and a distance dimension between the adjacent electrode fingers is the same as the width dimension, and the width dimension of the electrode finger and the distance dimension between the electrode fingers are set to be equal to or less than a minimum value or equal to or more than a maximum value of the width dimension of the electrode finger and the distance dimension between the electrode fingers in the input side tapered IDT electrode and the output side tapered IDT electrode.

In order to increase steepness at a high band side in a pass band, the width dimension of the electrode finger and the distance dimension between the electrode fingers in the grating reflector may be constituted to be the same as the minimum value of the width dimension of the electrode finger and the distance dimension between the electrode fingers in the IDT electrodes, or to be slightly smaller than the minimum value thereof, and further, in order to increase steepness at a low band side in the pass band, the width dimension of the electrode finger and the distance dimension between the electrode fingers in the grating reflector may be constituted to be the same as the maximum value of the width dimension of the electrode finger and the distance dimension between the electrode fingers in the IDT electrodes, or to be slightly larger than the maximum value thereof.

The width dimension of the electrode finger and the distance dimension between the electrode fingers in the grating reflector may be the same respectively in a direction perpendicular to the propagation direction of an elastic wave, and the width dimension of the electrode finger and the distance dimension between the electrode fingers in the grating reflector may be gradually widened when seen in a direction perpendicular to the propagation direction of an elastic wave. The group of electrode fingers in the grating reflector is formed to stride from an extension region of the bus bar on one side to an extension region of the bus bar on the other side in the input side tapered IDT electrode or the output side tapered IDT electrode, for example.

According to the elastic wave filter of the present invention, the width dimension of the electrode finger and the distance dimension between the electrode fingers in the grating reflector provided between the input side tapered IDT electrode and the output side tapered IDT electrode are constituted to be equal to or less than the minimum value of the width dimension of the electrode finger and the distance dimension between the electrode fingers in the IDT electrodes, or to be equal to or more than the maximum value thereof. Thus, attenuation in a stop band can be increased, and it is possible to obtain steep attenuation at the high band side or the low band side, and improve filter selectivity by matching the attenuation with a vicinity of the high band side or the low band side in the pass band.

BRIEF DESCRIPTION OF THE DRAWINGS

FIG. 17(a) and FIG. 17(b) are graphic diagrams showing the attenuation characteristic of the above-described elastic wave filter and an attenuation characteristic of a conventional elastic wave filter.

DETAILED DESCRIPTION OF THE PREFERRED EMBODIMENT(S)

(First Embodiment)

Figure 1:
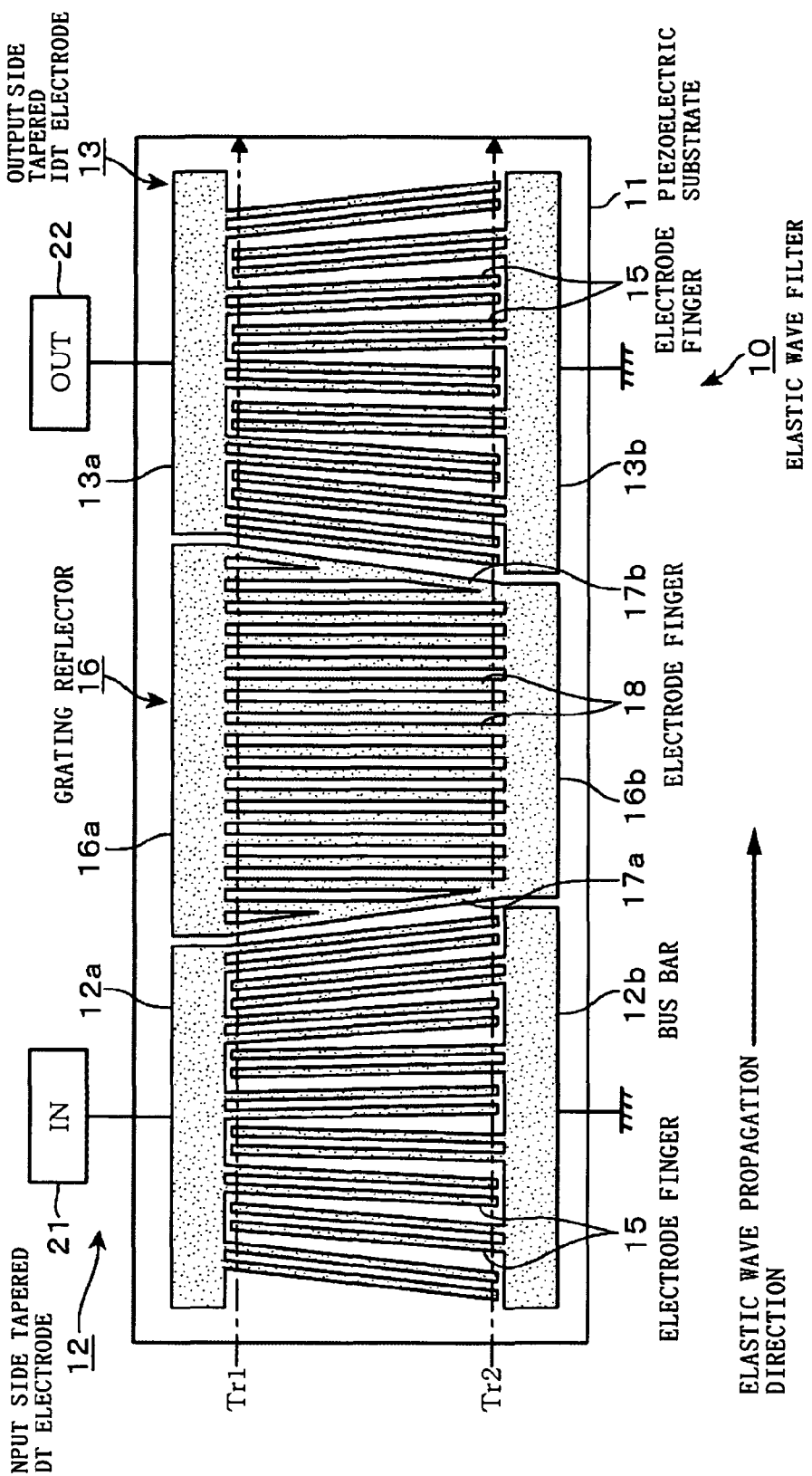
FIG. 1 is a plan view showing one example of an elastic wave filter according to an embodiment of the present invention.

An elastic wave filter 10 being a first embodiment of the present invention will be explained with reference to FIG. 1 and FIG. 2. The elastic wave filter 10 is designed to make attenuation at a high band side in a pass band steep, and there are formed an input side tapered IDT electrode 12 and an output side tapered IDT electrode 13 having the same configuration as those of the input side tapered IDT electrode 102 and the output side tapered IDT electrode 103 in the filter 100 shown in the drawing, which are already described, on a surface of a piezoelectric substrate 11. The input side tapered IDT electrode 12 and the output side tapered IDT electrode 13 are provided apart from each other in a propagation direction of an elastic wave. Note that in order to distinguish among a piezoelectric substrate, electrodes, and a reflector, the respective drawings showing the filter configuration are shown with a large number of dots added to the electrodes and the reflector for convenience sake.

In the input side tapered IDT electrode 12, 12a and 12b are a bus bar on one side and a bus bar on the other side respectively, which are formed to be parallel and faced to each other. The bus bar 12a on one side is connected to an input port 21, and the bus bar 12b on the other side is grounded.

Further, 15 is an electrode finger in the input side tapered IDT electrode 12. A group of electrode fingers composed of the plural electrode fingers 15 is formed so that two of the electrode fingers 15 are paired to be a SPLIT electrode, and the pairs are alternately arranged and extend from the bus bar 12a toward the bus bar 12b and extend from the bus bar 12b toward the bus bar 12a to be a comb shape.

Figure 2:
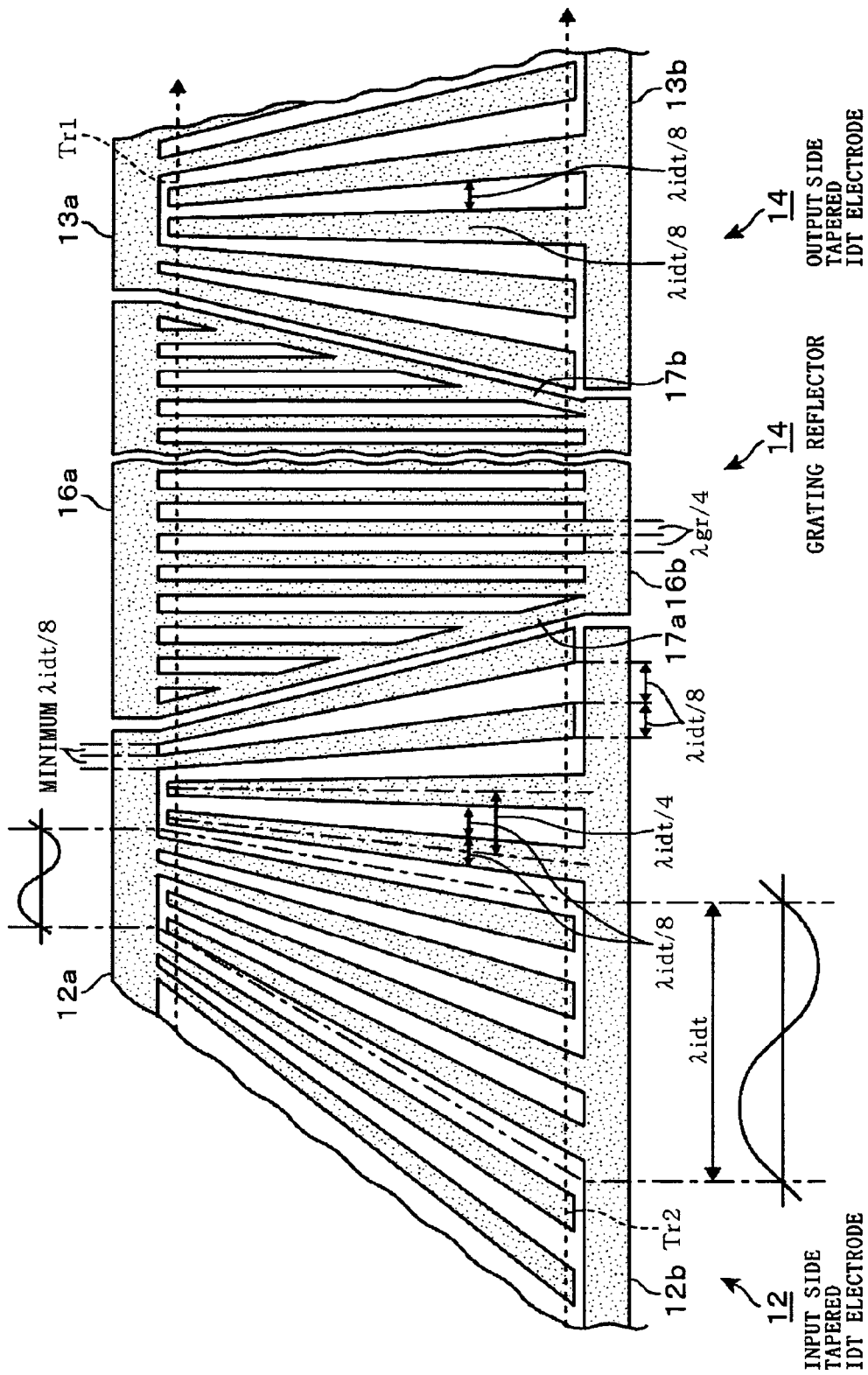
FIG. 2 is an enlarged plan view of some of the elastic wave filter.

As shown in FIG. 2, when seen in the propagation direction of an elastic wave, the respective electrode fingers 15 are formed so that width dimensions thereof are constant, and further distance dimensions (pitches) between the adjacent electrode fingers 15, 15 are constant and equal to the width dimension. Then, the electrode fingers 15 are each arranged so that an arrangement pattern in which a cycle unit having $\lambda idt$ in length, which is composed of the pair of the two electrode fingers 15 extending from the bus bar 12a on one side and the pair of the two electrode fingers 15 extending from the bus bar 12b on the other side, is repeated is constituted. In the elastic wave filter 10, an elastic wave having a wavelength the same as the cycle unit $\lambda idt$ in length propagates.

In this example, as described above, since the cycle unit $\lambda idt$ is formed by the four electrode fingers 15, particularly the four electrode fingers 15 and distances between the electrode fingers 15, 15, as for the adjacent electrode fingers 15, 15, a dimension between straight lines passing through the centers of the electrode fingers 15 is $\lambda idt/4$. Then in this example, the width dimension of the electrode finger 15 is $\lambda idt/8$, so that the distance dimension between the electrode fingers 15, 15 is also $\lambda idt/8$ ($\lambda idt/4 - \lambda idt/8 = \lambda idt/8$).

This arrangement pattern is formed so that the pitch between the electrode fingers 15 is gradually widened in a direction perpendicular to the propagation direction of an elastic wave from an upper side toward a lower side in the drawing and each of the widths is also gradually widened from the upper side toward the lower side. Accordingly, in the direction perpendicular to the propagation direction of an elastic wave, tracks being propagation paths of elastic waves are formed over a wide frequency band from Tr1 being a region where the cycle unit $\lambda idt$ is narrow to Tr2 being a region where the cycle unit $\lambda idt$ is wide, which are already described. Note that in FIG. 1, the width of the electrode finger 15 is depicted as a constant width for brevity of illustration.

The output side tapered IDT electrode 13 is configured similarly to the input side tapered IDT electrode 12 and provided with bus bars 13a and 13b that are paired and faced to each other. The bus bar 13a is provided on an extension of the bus bar 12a and the bus bar 13b is provided on an extension of the bus bar 12b respectively, and the bus bar 13a is connected to an output port 22 and the bus bar 13b is grounded.

Further, the output side tapered IDT electrode 13 is formed so that a large number of the electrode fingers 15 composing the similar arrangement pattern to that of the input side tapered IDT electrode 12 are provided, and as for these electrode fingers 15, the cycle unit $\lambda idt$ is constant in the propagation direction of an elastic wave, and in the direction perpendicular to the propagation direction of an elastic wave, the cycle unit $\lambda idt$ is widened from the tracks Tr1 to Tr2. Then, when seen in the propagation direction of an elastic wave, a width dimension of the electrode finger 15 and a distance dimension between the adjacent electrode fingers 15, 15 in the output side tapered IDT electrode 13 are formed to be the same as those in the already-described input side tapered electrode 12.

The cycle unit $\lambda idt$ varies from the track Tr1 to the track Tr2 as described above. Then, the width of the electrode finger 15 and the pitch between the electrode fingers 15, 15 constituting the smallest cycle unit $\lambda idt$ forming the track Tr1 are expressed as a minimum $\lambda idt/8$, and the width of the electrode finger 15 and the distance dimension between the electrode fingers 15, 15 constituting the largest cycle unit $\lambda idt$ forming the track Tr2 are expressed as a maximum $\lambda idt/8$.

Between the input side tapered IDT electrode 12 and the output side tapered IDT electrode 13, a grating reflector 16 is formed apart from these electrodes as shown in FIG. 1 and FIG. 2. The grating reflector 16 reflects an elastic wave having a wavelength $\lambda gr$ in accordance with an arrangement cycle of later-described electrode fingers 18 provided in the grating reflector 16 thereby suppressing propagation of the elastic wave from the input side tapered IDT electrode 12 to the output side tapered IDT electrode 13 to attenuate signal strength of a frequency corresponding to the wavelength $\lambda gr$, which is for forming what is called a stop band. Then, in this example, the stop band is matched with a stop band at the high band side rather than the pass band in the SAW filter 10, and the electrode fingers 18 are formed to make an attenuation characteristic at the high band side steep. As described above, an elastic wave having a wavelength with the same range as that of the cycle unit $\lambda idt$ in length propagates in the SAW filter 10, so that the wavelength $\lambda gr$ is here a value slightly smaller than the smallest cycle unit $\lambda idt$.

The grating reflector 16 is provided with bus bars 16a and 16b that are paired and faced to each other, and the bus bar 16a is provided on the extensions of the bus bars 12a and 13a, and the bus bar 16b is provided on the extensions of the bus bars 12b and 13b respectively.

Further, the grating reflector 16 is provided with an electrode finger 17a extending from an end portion on an input side of the bus bar 16a to an end portion on an input side of the bus bar 16b and an electrode finger 17b extending from an end portion on an output side of the bus bar 16a to an end portion on an output side of the bus bar 16b.

Then, a large number of the electrode fingers 18 extending from the bus bar 16a toward the bus bar 16b are provided between the electrode fingers 17a and 17b along the propagation direction of an elastic wave, and the electrode fingers 18 extend perpendicularly to an extending direction of each of the bus bars, namely to a traveling direction of an elastic wave. As described above, the electrode fingers 18 are formed in order to reflect the elastic wave having the wavelength $\lambda gr$ and suppress the propagation from the input side to the output side. In order to achieve the above purpose, a width dimension thereof is formed to be $\lambda gr/4$, and further a distance dimension (pitch) between the electrode fingers 18, 18 is constituted to be $\lambda gr/4$ the same as the width dimension in this example.

Since the value of the wavelength $\lambda gr$ is slightly smaller than a minimum value of the cycle unit $\lambda idt$ in this example as described above, $\lambda gr/4$ being the width dimension of the electrode finger 18 and the distance dimension between the electrode fingers 18, 18 is constituted to be a value slightly smaller than the minimum $\lambda idt/8$ being the width of the electrode finger 15 and the distance dimension between the electrode fingers 15, 15 forming the track Tr1. The slightly smaller value is a value in a range enabling an attenuation characteristic at the high band side in the filter to be steep.

Then, the electrode fingers 17a and 17b and the electrode fingers 18 form a propagation region of an elastic wave together with the electrode fingers 15 in the IDT electrodes 12 and 13, and elastic waves having wavelengths except $\lambda gr$ propagate through the propagation region to travel from the input side toward the output side in the grating reflector 16 as described above.

In the elastic wave filter 10 explained above, when a frequency signal is input to the input side tapered IDT electrode 12, namely when a frequency signal is input between the input port 21 and the ground, a surface acoustic wave (SAW) being an acoustic wave is generated. In the input side tapered IDT electrode 12, this elastic wave propagates to the output side (the right side in the drawing) in the track in which the cycle unit $\lambda idt$ corresponding to a length ($\lambda idt$) of a wavelength thereof is formed. As described above, in a predetermined track, the elastic wave having the wavelength corresponding to the cycle unit $\lambda idt$ of the track mainly propagates, but as is explained in the related art, an elastic wave having a wavelength not corresponding to the cycle unit $\lambda idt$ also propagates to the output side in the track.

Figure 3:
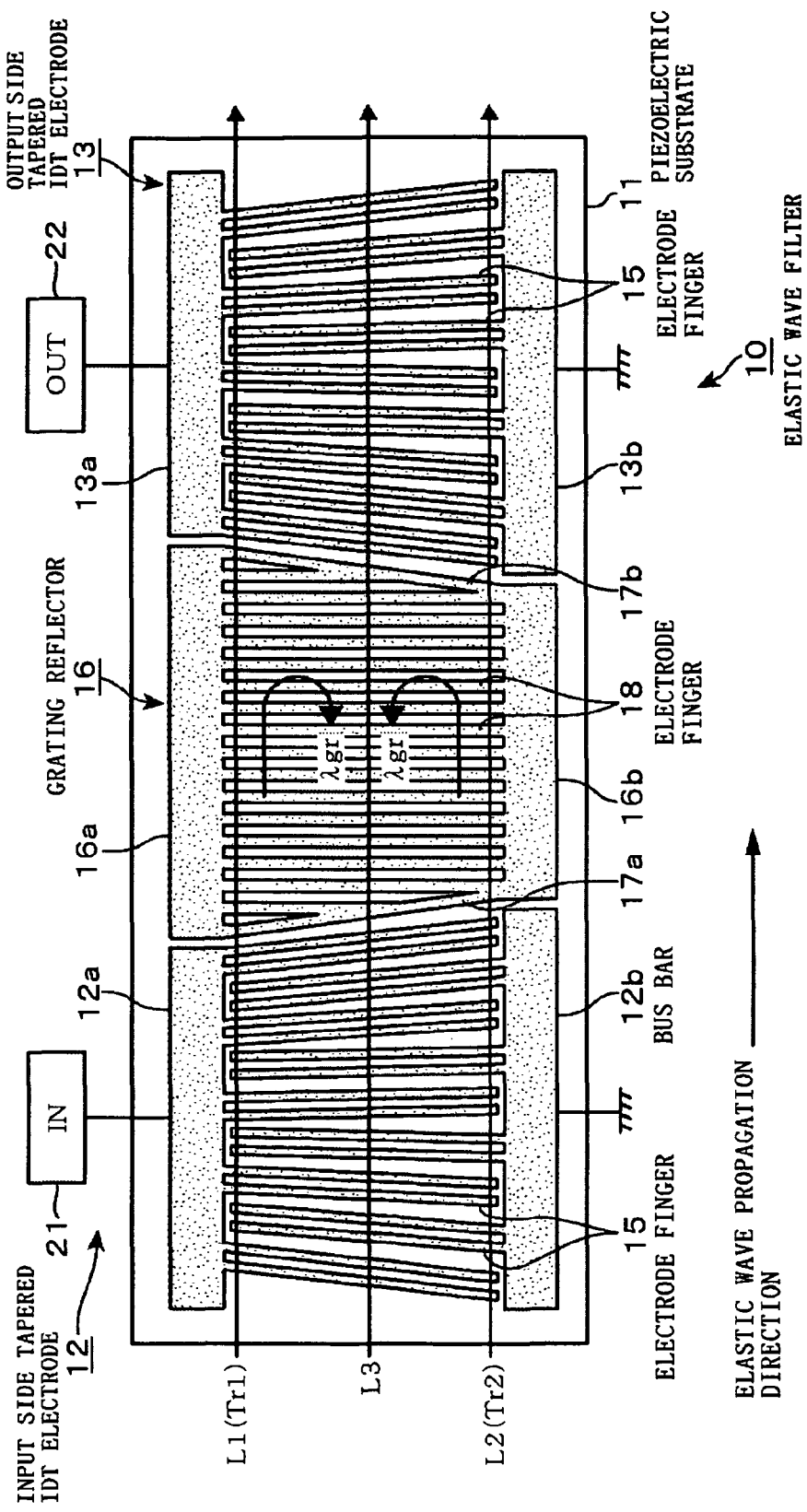
FIG. 3 is a schematic view showing how elastic waves propagate in the elastic wave filter.

FIG. 3 is a schematic view showing how the above elastic waves propagate, and linear lines L1, L2 and L3 show elastic waves propagating at every three positions in a length direction of the electrode fingers 15 and 18. L1 shows the elastic wave propagating in the above-described track Tr1 where the width of the electrode finger 15 and the distance between the electrode fingers 15 are formed to be the smallest, L2 shows the elastic wave propagating in the track Tr2 where the width of the electrode finger 15 and the distance between the electrode fingers 15 are formed to be the largest, and L3 shows the elastic wave propagating between the tracks Tr1 and Tr2 respectively, and in this case, wavelengths thereof become longer in the order of L1<L3<L2. As described above, only three types of the elastic waves propagating from the input side toward the output side are shown in FIG. 3, but in practice, tracks corresponding to respective wavelengths between the minimum track Tr1 and the maximum track Tr2 that are formed by the electrode fingers 15, 17, and 18 exist in the elastic wave filter 10, and elastic waves corresponding to the respective tracks propagate therein.

The elastic waves radiated from the input side tapered IDT electrode 12 to the output side are incident on the grating reflector 16 to propagate from the input side to the output side, but in this moment, the elastic wave having the wavelength $\lambda gr$ is reflected by the electrode fingers 18 in the grating reflector 16 as shown in FIG. 3, and the propagation to the output side is suppressed. Then, the elastic waves propagated to the end portion on the output side in the grating reflector 16 are incident on the output side tapered IDT electrode 13 from the grating reflector 16 to propagate to the output side (the right side in the drawing) in the tracks where the cycle unit $\lambda idt$ corresponding to the lengths ($\lambda idt$) of wavelengths thereof is formed. Thereafter, electrical signals corresponding to the elastic waves propagating in the respective tracks in the IDT electrode 13 are output.

Figure 4:
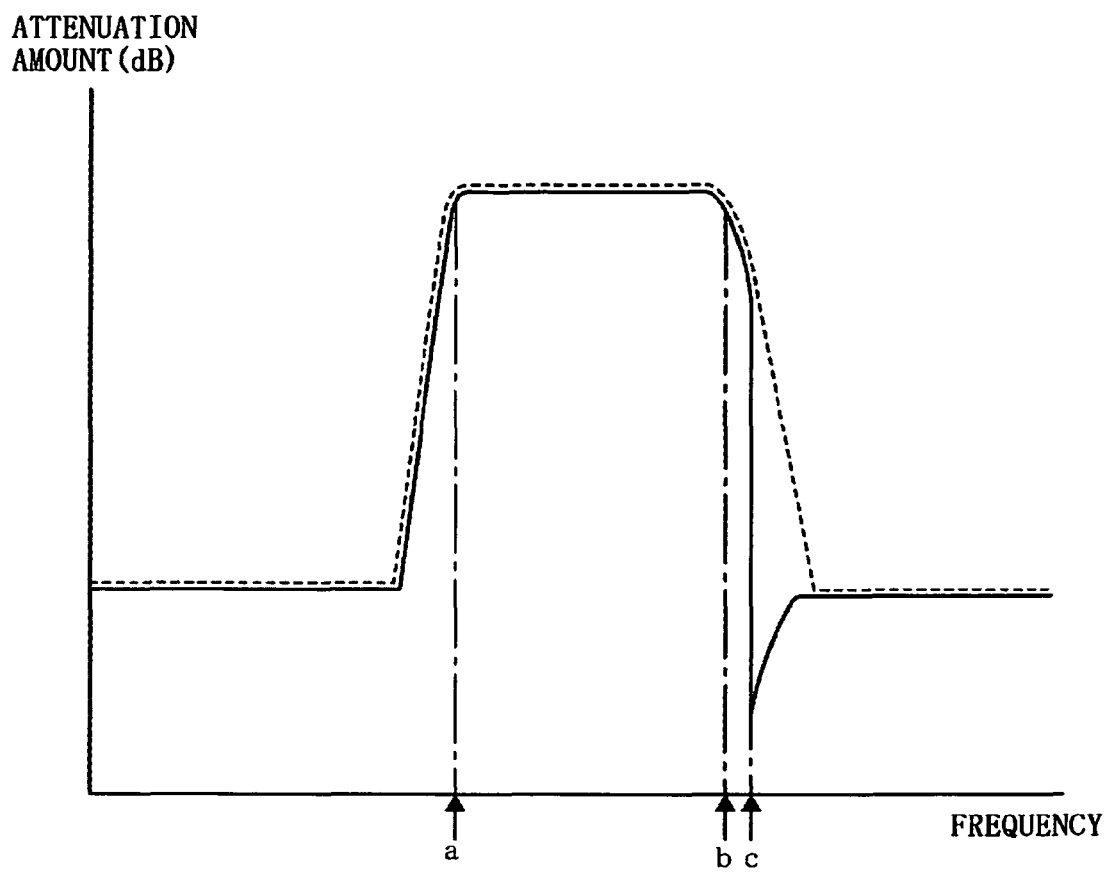
FIG. 4 is a graphic diagram showing an outline of an attenuation characteristic of a frequency in the elastic wave filter.

FIG. 4 shows an outline of a filter characteristic in the elastic wave filter 10 by a solid line graph. In order to show an effect created by suppressing the propagation of the elastic wave having the wavelength $\lambda gr$ as described above, FIG. 4 further shows an outline of a characteristic of a filter having the similar configuration to that of the elastic wave filter 10 except that the grating reflector 16 is not provided by a dotted line graph. The pass band in the elastic wave filter 10 is shown as from a to b in the drawing, and a and b are values corresponding to a maximum value of $\lambda idt$ and the minimum value of $\lambda idt$ respectively. In the elastic wave filter 10, a frequency signal c corresponding to the wavelength $\lambda gr$ is attenuated in the stop band, which is slightly close to the high band side, rather than the pass band as described above, so that, as shown in the graph, the attenuation at the high band side becomes steep compared with the case of no existence of the grating reflector 16. Thus, filter selectivity more improves than the case when the grating reflector 16 does not exist. As described already, the attenuation characteristic at the high band side is likely to deteriorate in the elastic wave filter provided with the tapered IDT electrodes, and therefore, it is particularly effective to make the attenuation at the high band side steep as described above.

As for the above-described elastic wave filter 10, $\lambda gr/4$ being the width of the electrode finger 18 and the pitch between the electrode fingers 18 is formed slightly smaller than the minimum $\lambda\lambda dt/8$ being the minimum width of the electrode finger 15 and the minimum pitch between the electrode fingers 15, but even when these are formed equally to each other, attenuation is obtained at an end portion of the high band side in the pass band, so that the above-described effect can be obtained.

(Second Embodiment)

Figure 5:
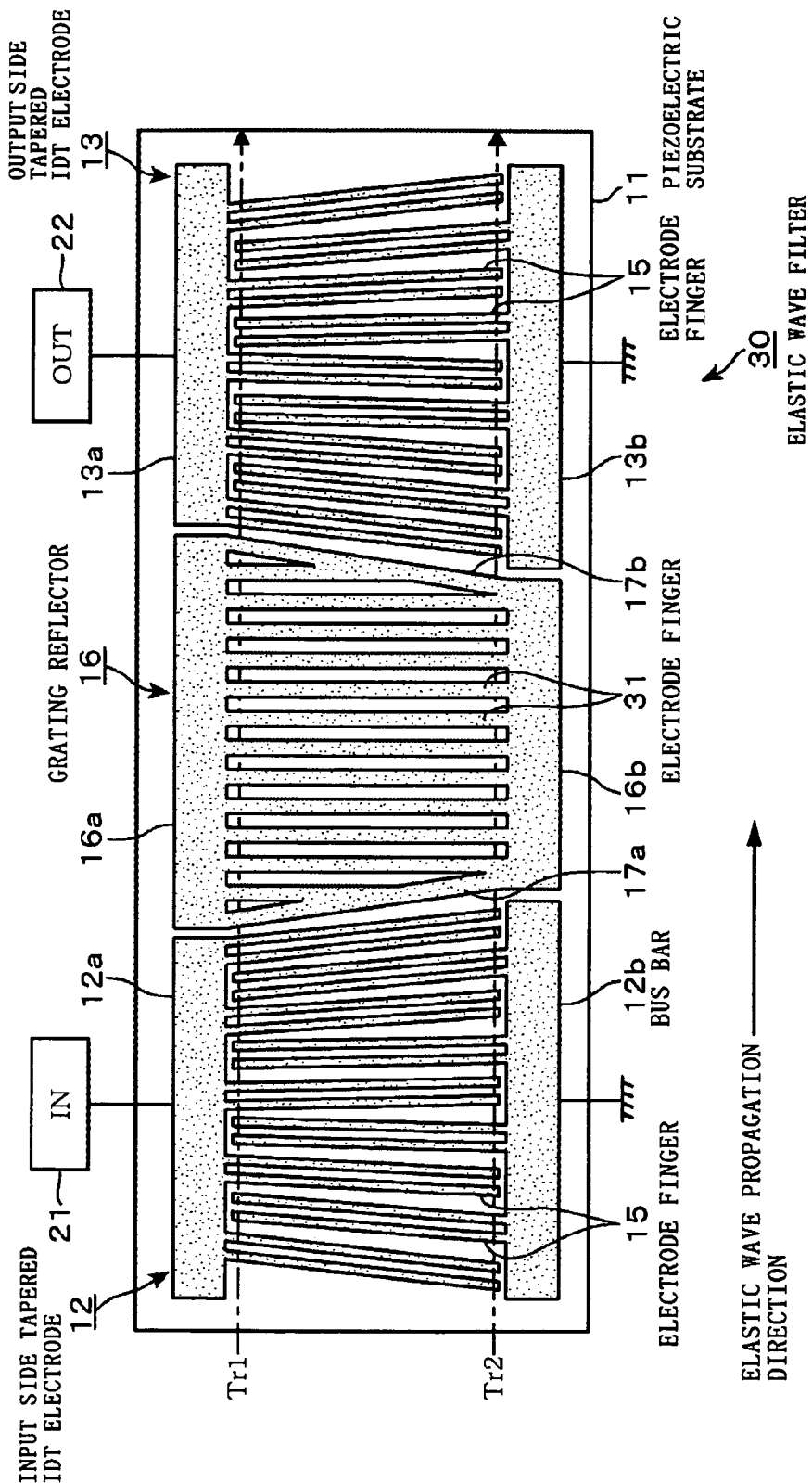
FIG. 5 is a plan view showing an elastic wave filter according to another embodiment of the present invention.
Figure 6:
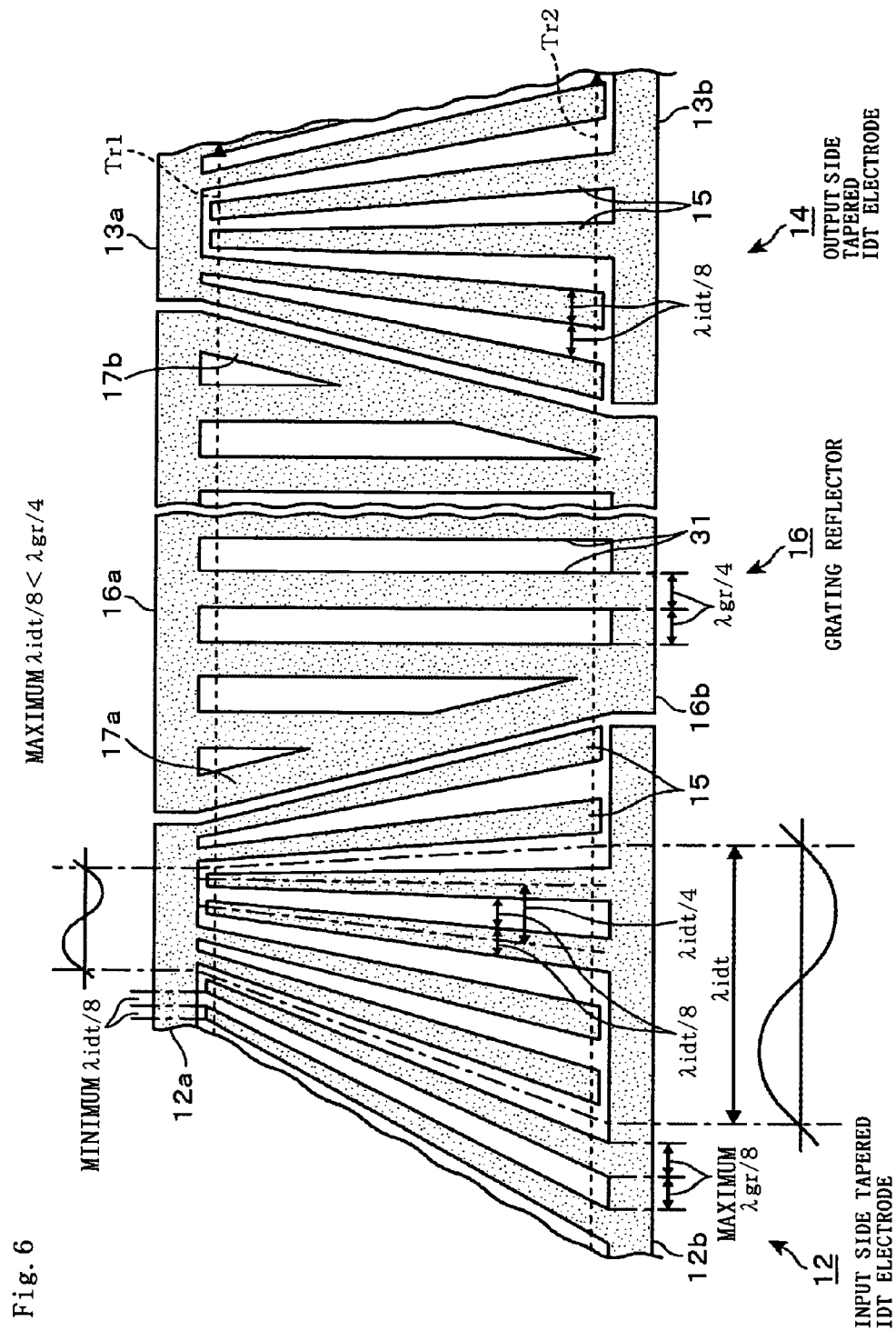
FIG. 6 is an enlarged plan view of some of the elastic wave filter.

Subsequently, an elastic wave filter 30 in a second embodiment will be explained with reference to FIG. 5 and FIG. 6. The elastic wave filter 30 is designed to make attenuation at a low band side in a pass band thereof steep, and hereinafter, points different from the configuration of the elastic wave filter 10 will be mainly explained. A grating reflector 16 in the elastic wave filter 30 is provided with a large number of electrode fingers 31 in place of a large number of the electrode fingers 18. The electrode fingers 31 are formed to have equal widths, and extend from a bus bar 16$a$ to a bus bar 16$b$, and are arranged at equal distances from an input side to an output side repeatedly. Then, $\lambda gr/4$ being a width dimension of the electrode finger 31 and a distance dimension (pitch) between the adjacent electrode fingers 31, 31 is formed slightly larger than a maximum $\lambda idt/8$ being a width dimension of an electrode finger 15 and a distance dimension between the electrode fingers 15, 15 in IDT electrodes 12 and 13. Forming slightly larger described here means that the width dimension of the electrode finger 31 and the distance dimension between the electrode fingers 31 are formed large in a range enabling attenuation at the low band side in the pass band to be steep.

Then, when elastic waves propagate from the input side tapered IDT electrode 12 toward the output side tapered IDT electrode 13 similarly to the first embodiment, propagation of an elastic wave having a frequency corresponding to the width dimension of the electrode finger 31 and the distance dimension between the electrode fingers 13 toward the output side tapered IDT electrode 13 is suppressed in the grating reflector 16.

Figure 7:
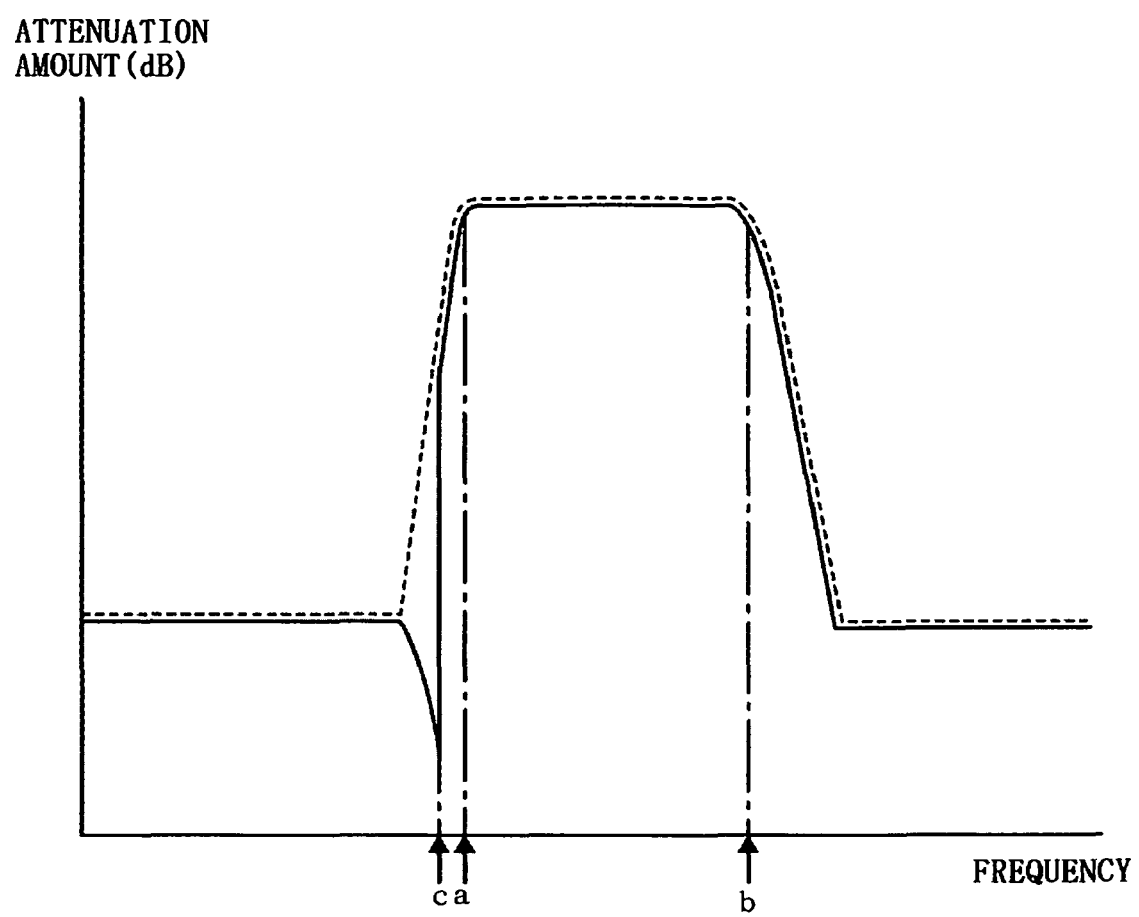
FIG. 7 is a graphic diagram showing an outline of an attenuation characteristic of a frequency in the elastic wave filter.

FIG. 7 shows an outline of a filter characteristic in the case when propagation of an elastic wave having a wavelength $\lambda gr$ is suppressed in the grating reflector 16 in the elastic wave filter 30 as described above by a solid line graph. Further similarly to the explanation in the first embodiment, in order to show the effect created by suppressing the propagation of the elastic wave having the wavelength $\lambda gr$, an outline of a filter characteristic in the elastic wave filter 30 in the case of the grating reflector 16 not being provided is shown by a dotted line graph. Since the arrangement of the electrode fingers 31 is designed so that attenuation can be obtained in a stop band, which is slightly close to the low band side, rather than the pass band in this example as described above, a frequency signal c corresponding to $\lambda gr$ is attenuated at the low band side rather than a pass band shown as from a to b as shown by the solid line. Consequently, a steep attenuation characteristic can be obtained at the low band side compared with the case of not providing the grating reflector 16.

Further, $\lambda gr/4$ being the width dimension of the electrode finger 31 and the distance dimension between the electrode fingers 31 is formed slightly larger than the maximum $\lambda idt/8$ being the maximum width dimension of the electrode finger 15 and the maximum distance dimension between the electrode fingers 15 in the IDT electrodes 12 and 13 in the elastic wave filter 30 as described above, but $\lambda gr/4$ may be set to be the same as the maximum $\lambda idt/8$. In the above case as well, a signal is attenuated at an end portion of the low band side in the pass band, resulting that the steep attenuation characteristic can be obtained.

(Third Embodiment)

Figure 8:
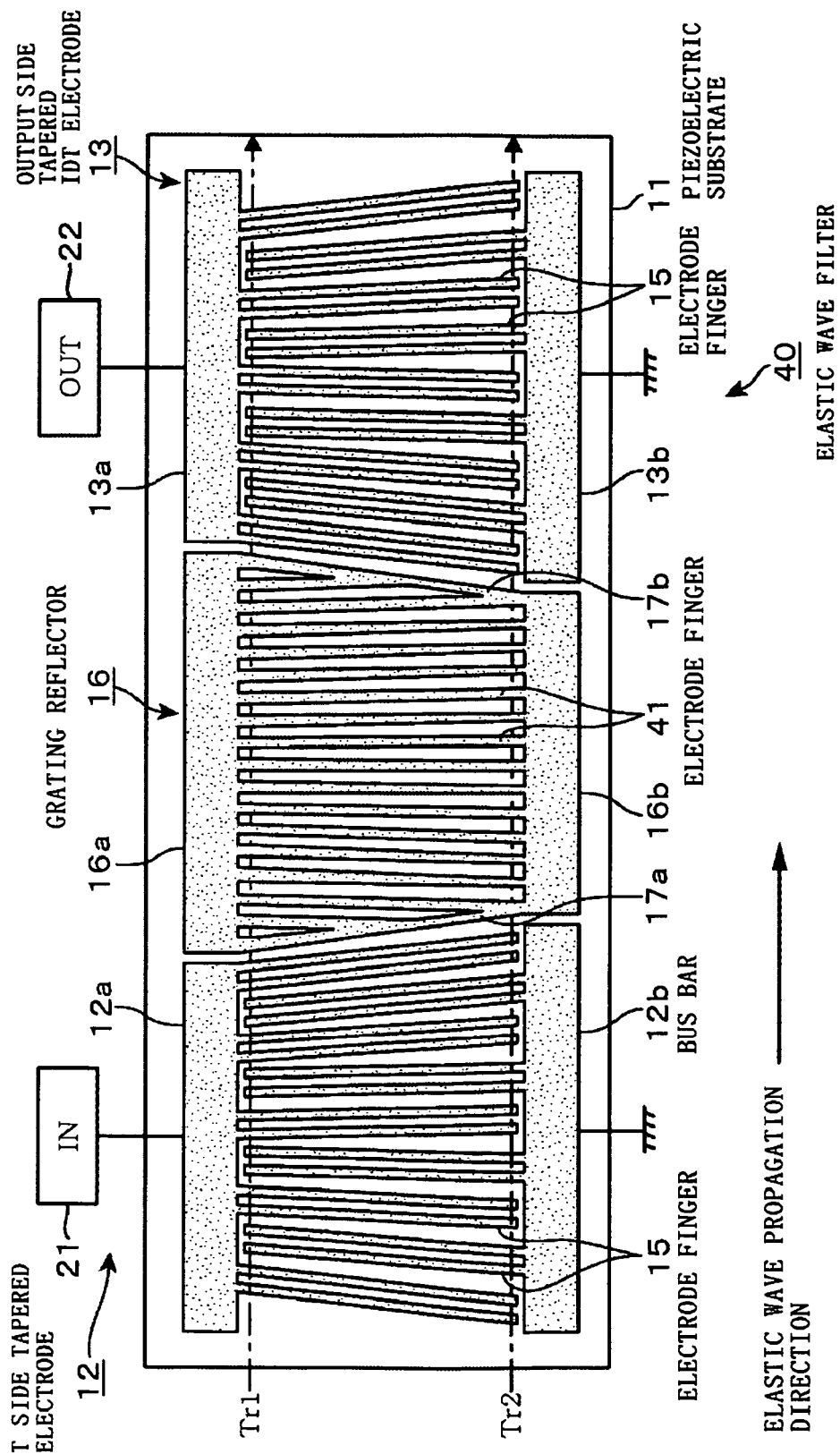
FIG. 8 is a plan view showing an elastic wave filter according to another embodiment of the present invention.
Figure 9:
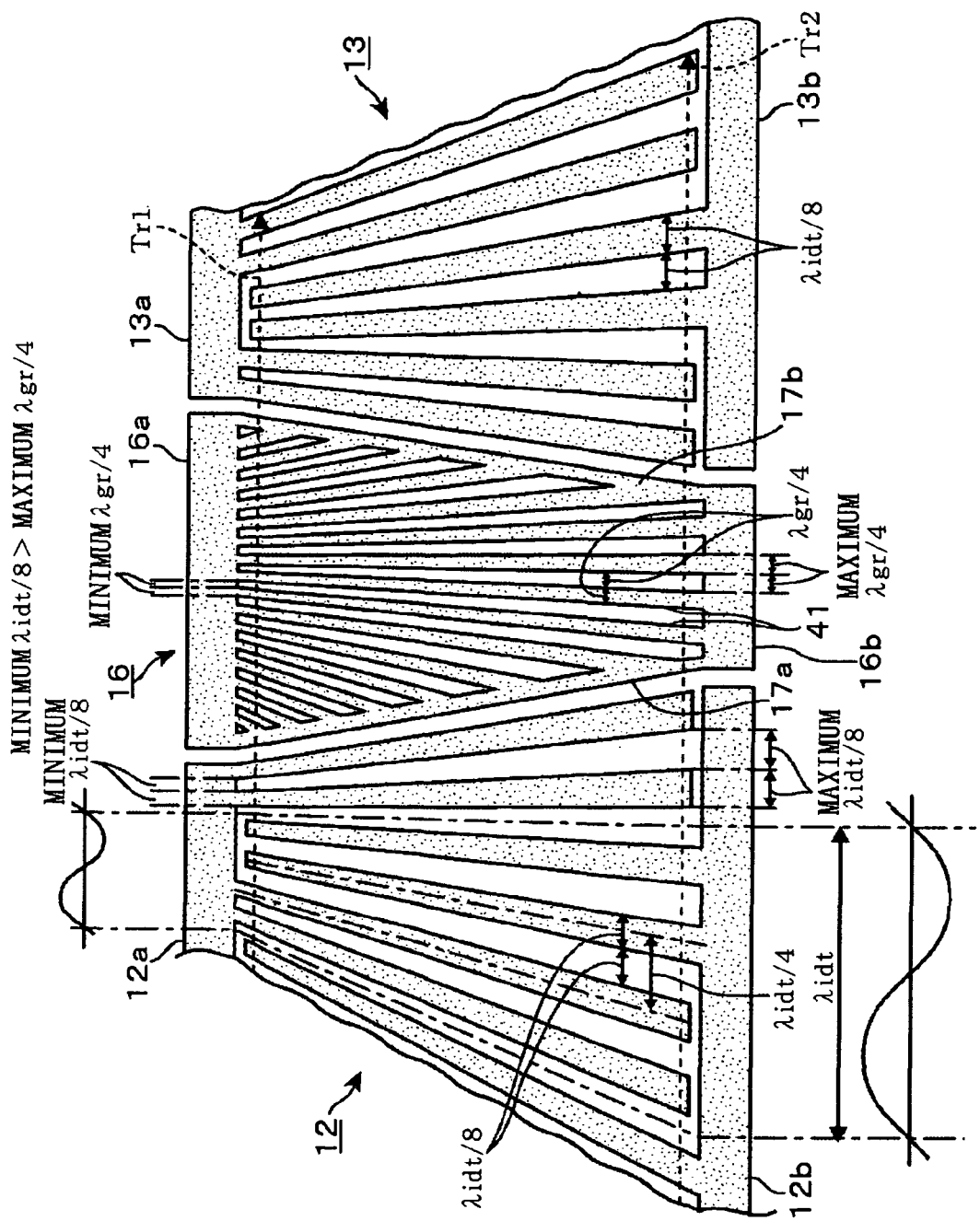
FIG. 9 is an enlarged plan view of some of the elastic wave filter.

Subsequently, an elastic wave filter 40 in a third embodiment will be explained with reference to FIG. 8 and FIG. 9. The elastic wave filter 40 is designed to make attenuation in a stop band at a high band side in a pass band thereof steep similarly to the elastic wave filter 10 in the first embodiment, and is further configured to attenuate frequency signals in a range wider than that of the elastic wave filter 10 in the stop band. Hereinafter, points different from the configuration of the elastic wave filter 10 will be mainly explained. In a grating reflector 16 in the elastic wave filter 40, an arrangement pattern of electrode fingers 41 provided in place of the already-described electrode fingers 18 is formed so that a distance between the adjacent electrode fingers 41, 41 is gradually widened from an upper side toward a lower side in the drawing, namely in a direction perpendicular to a propagation direction of an elastic wave, and further each width thereof is also gradually widened from the upper side toward the lower side.

When seen in the propagation direction of an elastic wave then, a width dimension of the electrode finger 41 and a distance dimension between the adjacent electrode fingers 41, 41 are formed equally. As explained in the first embodiment, as for an elastic wave having a wavelength $\lambda gr$, the elastic wave is reflected by making the width dimension of the electrode finger and the distance dimension between the electrode fingers in the grating reflector 16 $\lambda gr/4$, and a frequency signal corresponding to the wavelength can be attenuated. Thus, frequency signals in a range wider than that of the first embodiment can be attenuated by varying the width and the pitch from a bus bar 16$a$ toward a bus bar 16$b$.

As described above, this example has a purpose to obtain attenuation at the high band side in the pass band. Therefore, the grating reflector 16 reflects the elastic wave having the wavelength $\lambda gr$ in a range from a slightly smaller value to a much lower value than a minimum value of a cycle unit $\lambda idt$ in IDT electrodes 12 and 13, and the largest width dimension of the electrode finger 41 and the largest distance dimension between the electrode fingers 41 (maximum $\lambda gr/4$) in the grating reflector 16 are formed slightly smaller than a minimum $\lambda idt/8$ being the minimum width of the electrode finger 15 and the minimum distance dimension between the electrode fingers 15 in the IDT electrodes 12 and 13 so that the purpose can be achieved. Note that in FIG. 9, in order to show relation between the width of the electrode finger 41 and the distance between the electrode fingers 41 in the grating reflector 16 and the width of the electrode finger 15 and the distance between the electrode fingers 15 in the IDT electrodes 12 and 13, a length of each portion in a lateral direction to a vertical length of each portion is shown larger than that in FIG. 8, and further the number of the electrode fingers 41 is shown smaller than that in FIG. 8.

Figure 10:
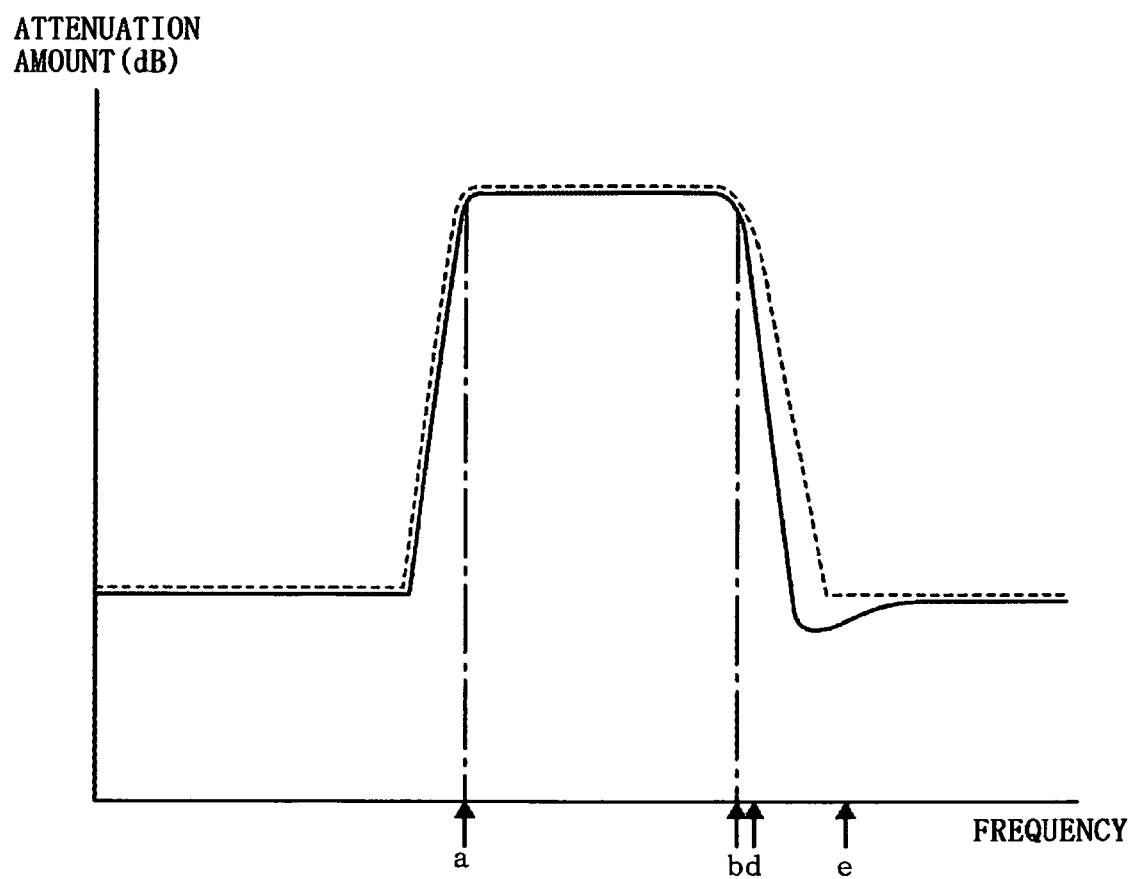
FIG. 10 is a graphic diagram showing an outline of an attenuation characteristic of a frequency in the elastic wave filter.

FIG. 10 shows an outline of a filter characteristic in the elastic wave filter 40 by a solid line graph, and further similarly to the explanation in the first embodiment, in order to show the effect created by suppressing the propagation of the above-described elastic wave, an outline of a filter characteristic in the elastic wave filter 40 in the case of the grating reflector 16 not being provided is shown by a dotted line graph. As described above, in the elastic wave filter 40, the propagation of the wavelength $\lambda gr$ in a range wider than that in the elastic wave filter 10 is suppressed. As a result, frequency signals are attenuated in a range from d to e, which correspond to a maximum value to a minimum value of the wavelength $\lambda gr$ whose propagation is suppressed, at the high band side in the pass band. Since elastic waves having wavelengths different depending on tracks are reflected by varying the width and pitch of the electrode finger from the bus bar 16a toward the bus bar 16b in the grating reflector 16 in the SAW filter 40, an attenuation in a predetermined frequency becomes smaller than that in the SAW filter 10, but as described above, it is possible to obtain attenuation in a wide range, and make the attenuation at the high band side steep. Note that in this example, the wavelength λgr of the elastic wave to be reflected may be equal to or less than the cycle unit λidt, and the minimum λidt/8 and the maximum λgr/4 thus may be set to be the same each other.

(Fourth Embodiment)

Figure 11:
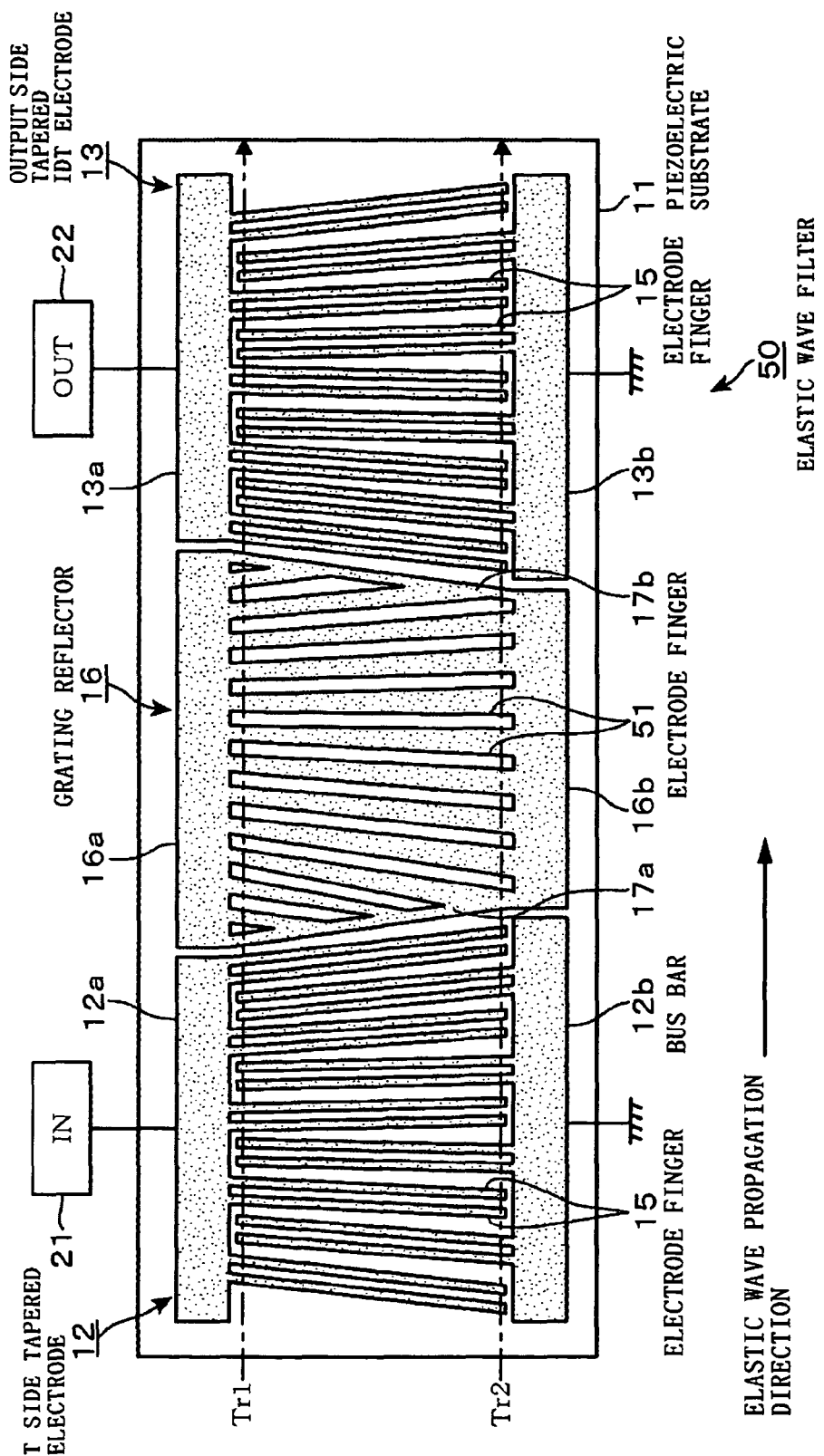
FIG. 11 is a plan view showing an elastic wave filter according to still another embodiment of the present invention.
Figure 12:
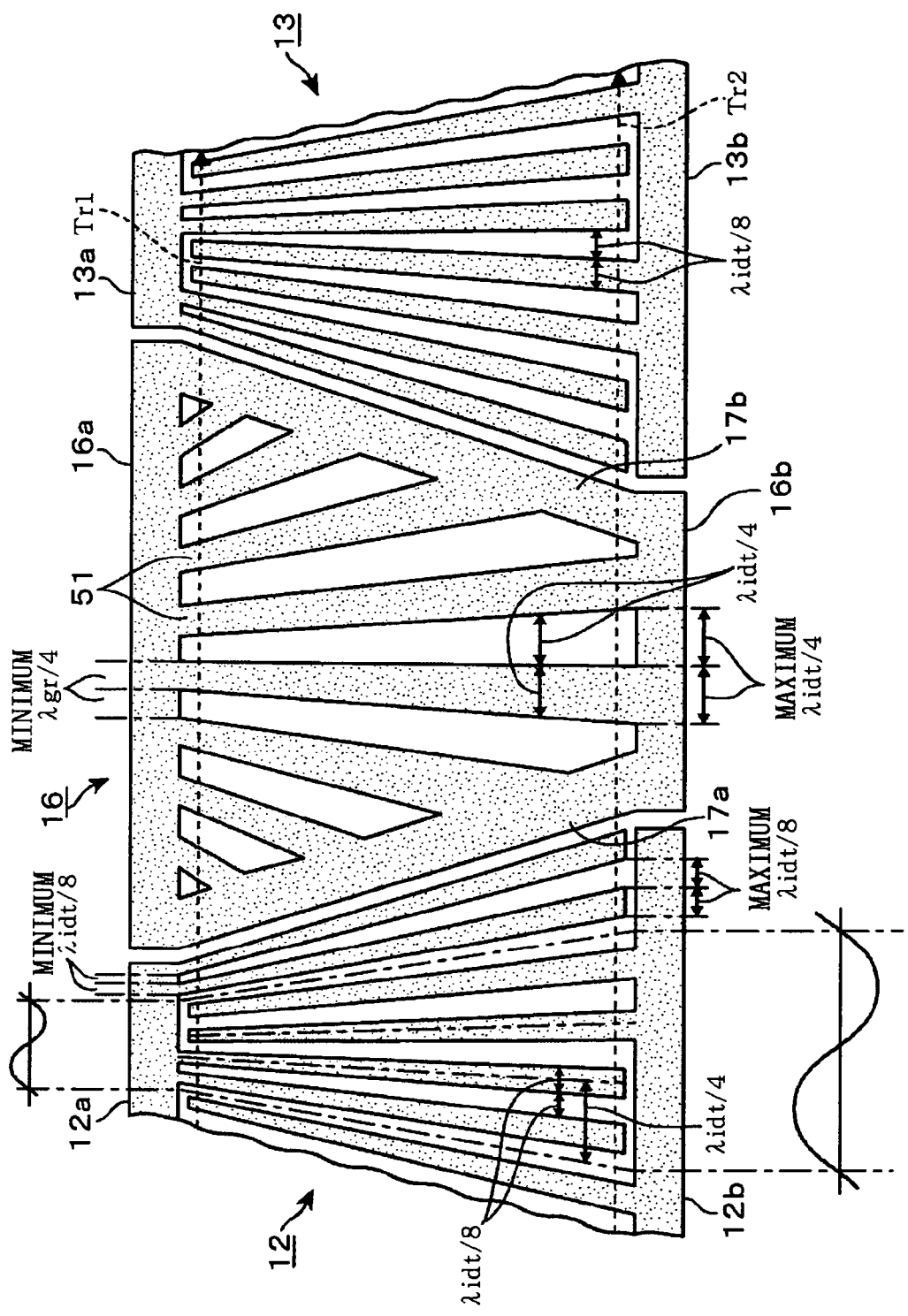
FIG. 12 is an enlarged plan view of some of the elastic wave filter.

Subsequently, an elastic wave filter 50 in a fourth embodiment will be explained with reference to FIG. 11 and FIG. 12. The elastic wave filter 50 is designed to make attenuation in a stop band at a low band side in a pass band thereof steep similarly to the elastic wave filter 30 in the second embodiment, and is further configured to attenuate frequency signals in a range wider than that of the elastic wave filter 30 in the stop band. In a grating reflector 16 in the elastic wave filter 50, an arrangement pattern of electrode fingers 51 thereof is formed so that a distance between the electrode fingers 51 is gradually widened from an upper side toward a lower side in the drawing in a direction perpendicular to a propagation direction of an elastic wave, and further each width thereof is also gradually widened from the upper side toward the lower side similarly to the third embodiment. When seen in the propagation direction of an elastic wave, a width dimension of the electrode finger 51 and a distance dimension between the electrode fingers 51, 51 are equal.

In order to obtain attenuation at the low band side as described above by reflecting an elastic wave having a wavelength λgr in a range from a slightly larger value to a much larger value than a maximum value of a cycle unit λidt in IDT electrodes in the grating reflector 16, the smallest width dimension of the electrode finger 51 and the smallest distance dimension between the electrode fingers 51 (minimum λgr/4) in the grating reflector 16 are formed slightly larger than a maximum λidt/8 being a maximum width of an electrode finger 15 and a maximum distance dimension between the electrode fingers 15 in the IDT electrodes 12 and 13. Note that in FIG. 12, in order to show relation between the width of the electrode finger 51 and the distance between the electrode fingers 51 in the grating reflector 16 and the width of the electrode finger 15 and a distance between the electrode fingers 15 in the IDT electrodes 12 and 13, a length of each portion in a lateral direction to a vertical length of each portion is shown larger than that in FIG. 11, and further the number of the electrode fingers 51 is shown smaller than that in FIG. 11.

Figure 13:
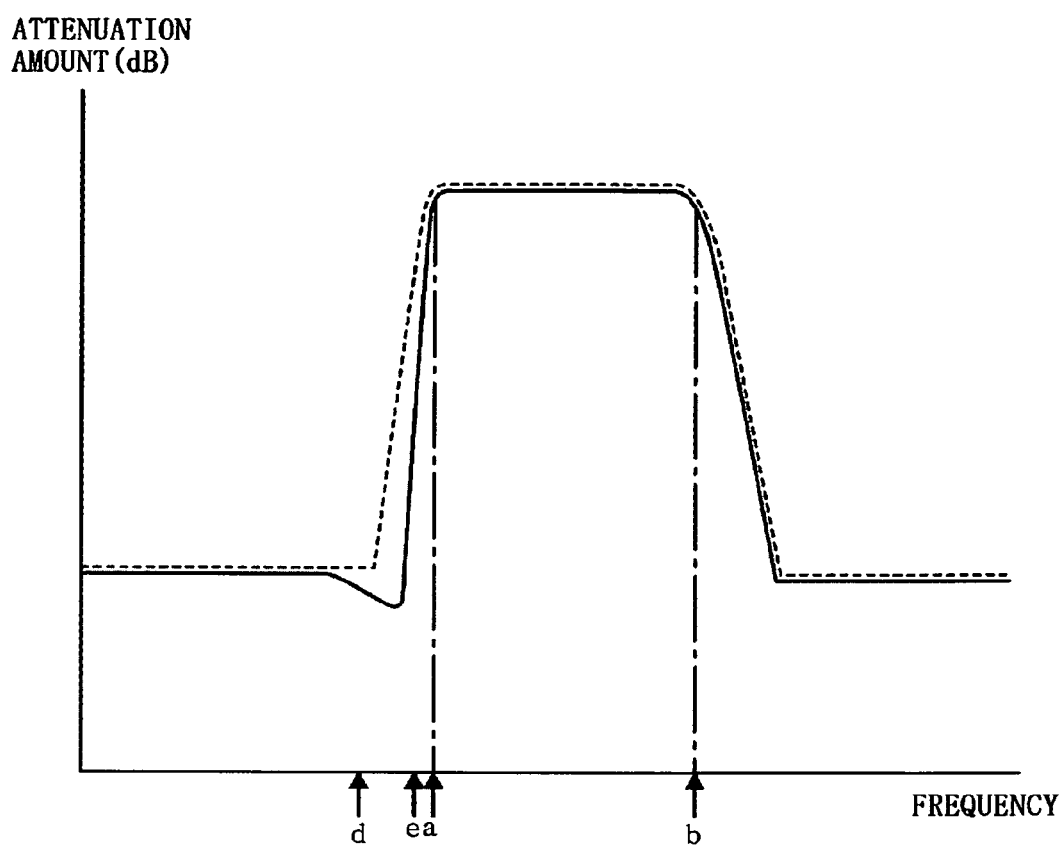
FIG. 13 is a graphic diagram showing an outline of an attenuation characteristic of a frequency in the elastic wave filter.

FIG. 13 shows an outline of a filter characteristic in the case when the propagation of the elastic wave having λgr is suppressed in the grating reflector 16 as described above in the elastic wave filter 50 by a solid line, and further similarly to the explanation in the first embodiment, in order to show the effect created by suppressing the propagation of the above-described elastic wave, an outline of a filter characteristic in the elastic wave filter 50 in the case of the grating reflector 16 not being provided is shown by a dotted line. As described above, in this example, propagations of elastic waves having frequencies in a wide range are suppressed in the stop band at the low band side rather than the pass band compared with the elastic wave filter 30. Since elastic waves having different wavelengths are respectively reflected in respective tracks in the grating reflector 16 in the elastic wave filter 50 similarly to the respective tracks in the grating reflector in the elastic wave filter 40, an attenuation in a predetermined frequency becomes smaller than that in the SAW filter 30, but as shown in the drawing, it is possible to obtain attenuation in a wide range, and make the attenuation at the low band side in the pass band steep.

Note that in this example, the wavelength λgr of the elastic wave to be reflected may be equal to or more than the cycle unit λidt, and the maximum λidt/8 and the minimum λgr/4 thus may be set to be the same each other.

In the third and fourth embodiments, the width and pitch of the electrode finger in the grating reflector 16 are widened as they go downward, but they may be constituted to be widened as they go upward.

Figure 14:
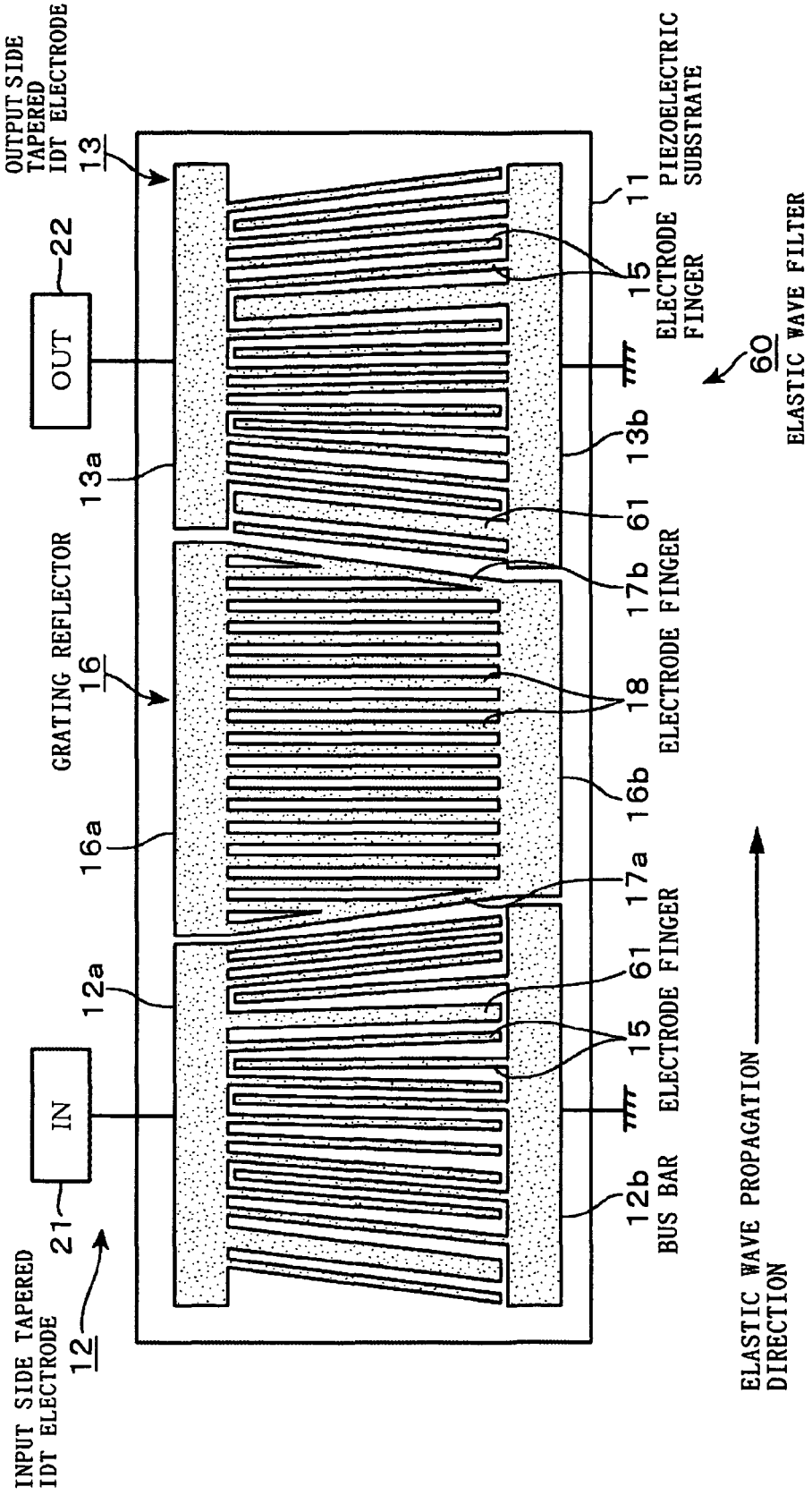
FIG. 14 is a plan view showing an elastic wave filter according to still another embodiment of the present invention.

Further, FIG. 14 shows an example where the input side tapered IDT electrode and the output side tapered IDT electrode in the elastic wave filter 10 in the first embodiment are configured to be a uni-direction electrode in place of being the SPLIT electrode. In an elastic wave filter 60 in this example, similarly to the elastic wave filter 10, a cycle unit λidt is constituted by four electrode fingers 15 and distance regions between the electrode fingers 15, and further is constituted by a set of the single electrode finger 15 extending from a bus bar 12a or a bus bar 13a on one side and the three electrode fingers 15 arranged adjacently to the electrode finger 15 and extending from a bus bar 12b or a bus bar 13b on the other side in an input side tapered IDT electrode 12 and an output side tapered IDT electrode 13. Then, a reflecting source 61 being an electrode finger having a width of, for example, ⅜ λidt is provided between the electrode fingers 15 having a width of λidt/8, and thereby the input side tapered IDT electrode 12 and the output side tapered IDT electrode 13 are configured as a DART (Distributed acoustic reflection transducer) electrode. The reflecting source 61 has a width of ⅜ λidt in each track Tr similarly to the electrode finger 15, but actually has different widths in a vertical direction in the drawing.

The input side tapered IDT electrode 12 and the output side tapered IDT electrode 13 may be configured to be an EWC-SPUDT (Electrode Width Controlled-SPUDT) electrode in place of being the DART electrode. Further, the width of the reflecting source 61 may be, for example, λidt/4 that is the same as that of the electrode finger in the grating reflector, and further, in the case when the electrode fingers 15 in the input side tapered IDT electrode 12 and the output side tapered IDT electrode 13 are connected to both of the bus bars 12a (13a) and 12b (13b) respectively, the width of the reflecting source 61 may be equal to or less than ⅝ λidt.

The elastic wave filter 60 uses multiple reflection aggressively thereby achieving further lowering of loss and further enhancing selectivity, and furthermore the reflecting sources 61 are provided as described above, so that lowering of loss can be achieved without being accompanied by ripple increase due to a TTE (triple transit echo). Further, as the uni-direction electrode, besides the above configuration, for example, an FEUDT (Floating Electrode type Uni-Direction Transducer) electrode, a DWSF-SPUDT (Different Width Split Finger-SPUDT) electrode or the like may be acceptable. Further, any of these uni-direction electrodes may be used as the input side tapered IDT electrode 12 or the output side tapered IDT electrode 13 shown in FIG. 1 described already.

Figure 15:
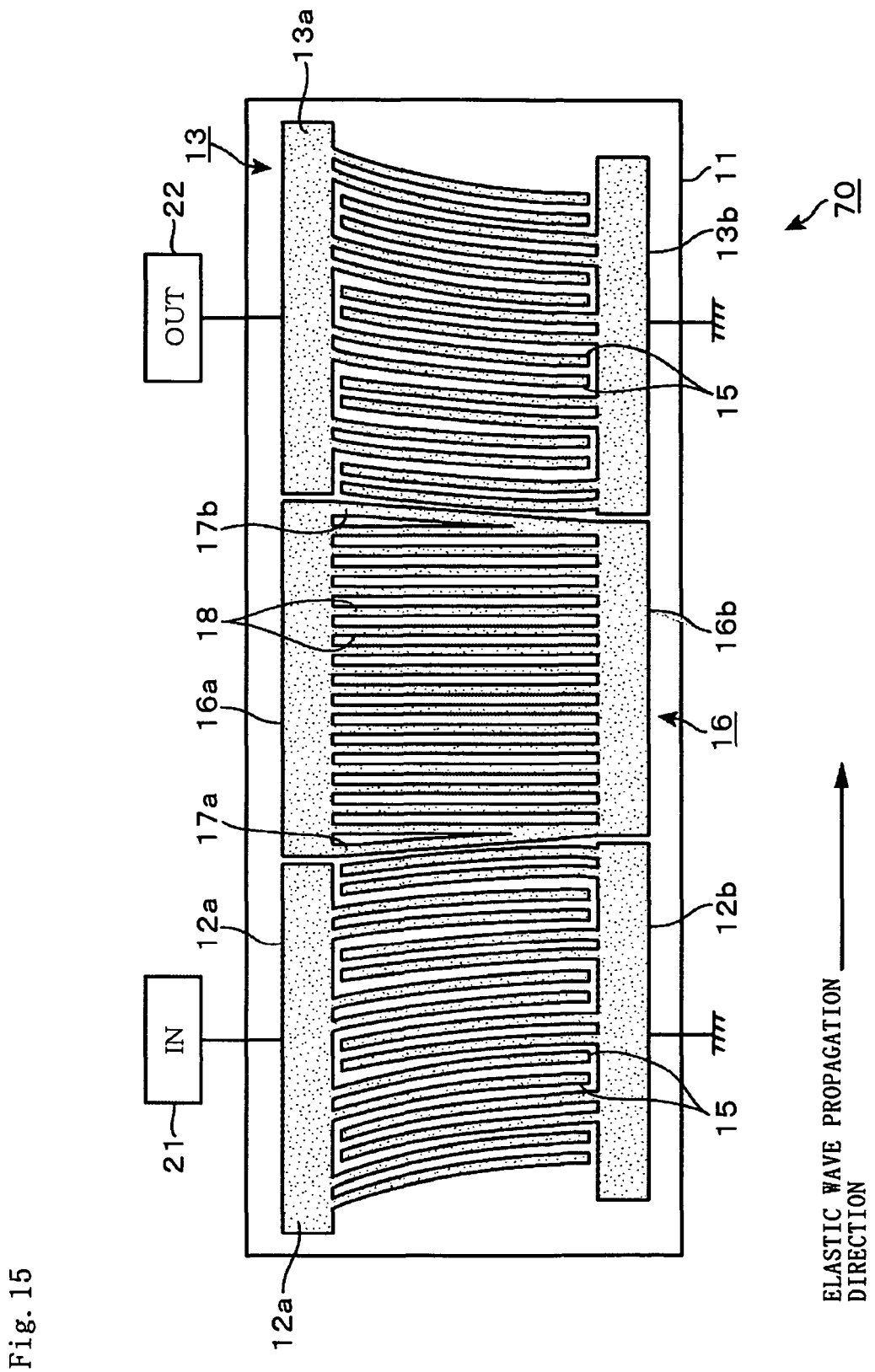
FIG. 15 is a plan view showing an elastic wave filter according to still another embodiment of the present invention.
Figure 16:
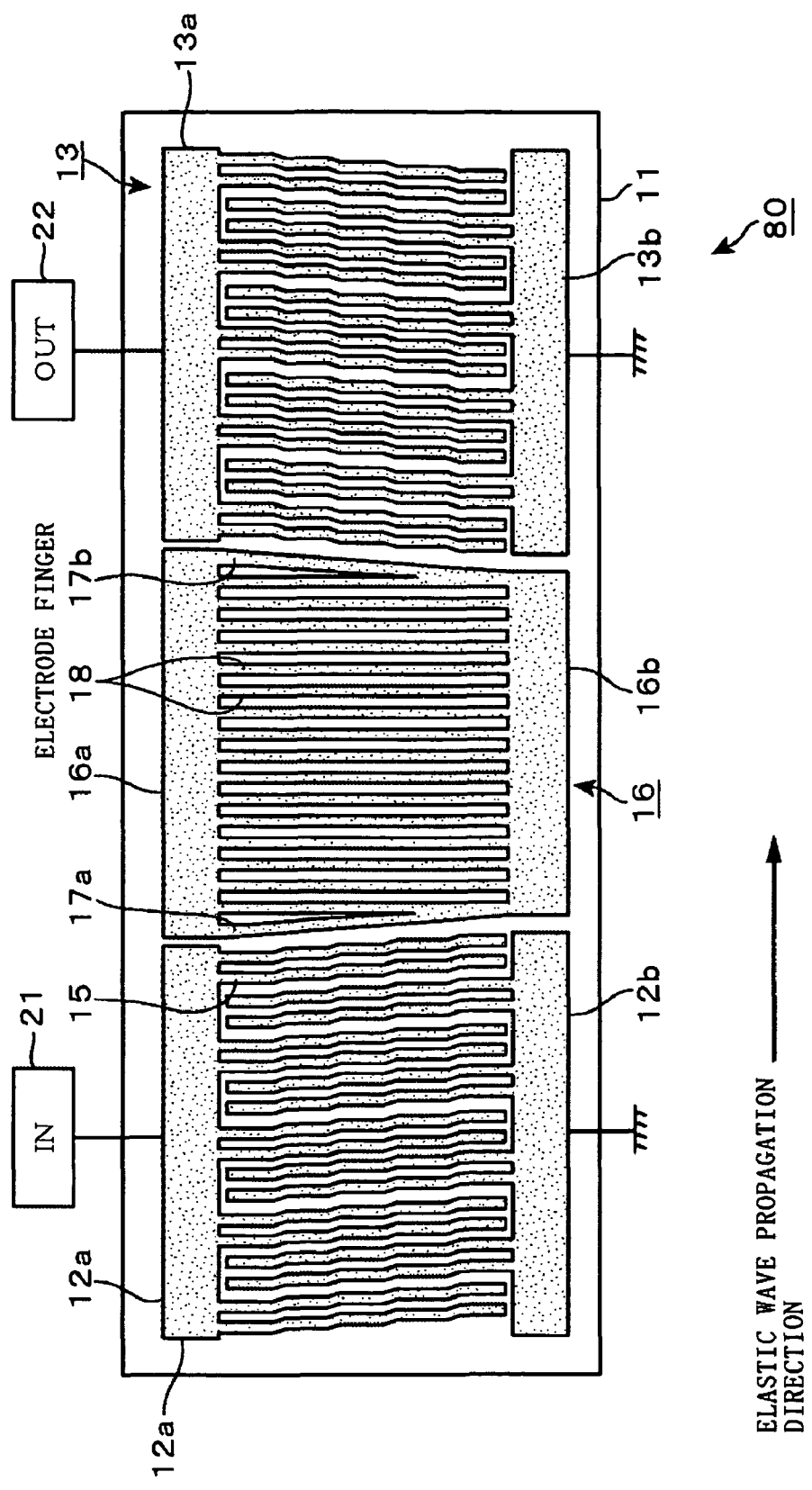
FIG. 16 is a plan view showing an elastic wave filter according to still another embodiment of the present invention.
Figure 18:
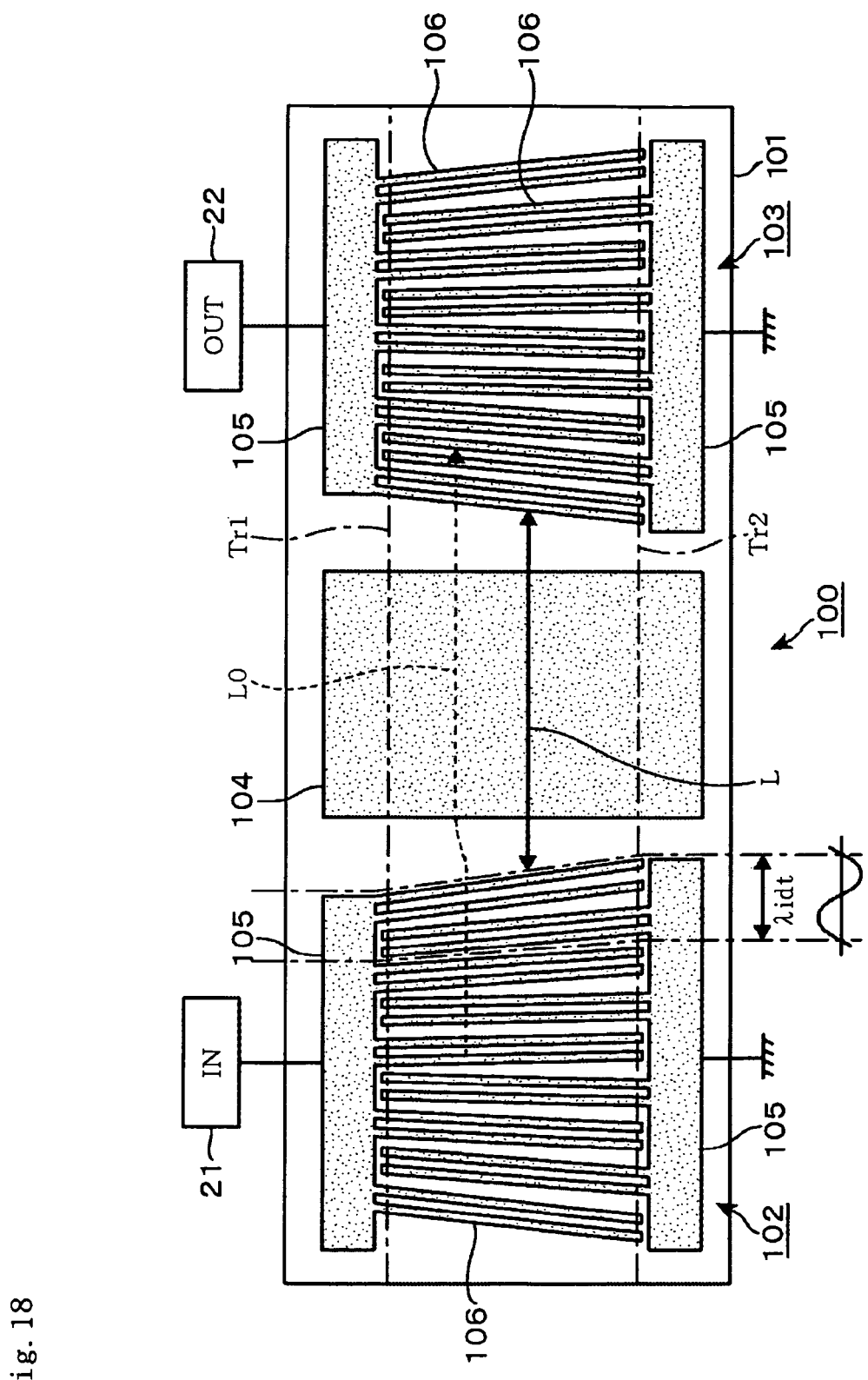
FIG. 18 is a plan view showing the conventional elastic wave filter.

Further, although the respective electrode fingers 15 in the tapered IDT electrodes 12 and 13 are continuously and linearly widened in each of the above-described examples, they may be widened curvedly as electrode fingers in an elastic wave filter 70 shown in FIG. 15, or they may be widened in stages as an elastic wave filter 80 shown in FIG. 16, so that they are formed in what is called a pseudotapered form. Note that also in FIGS. 15 and 16, arrangement patterns composed of widths and distance regions of electrode fingers 15 are arranged respectively to be widened from an upper side toward a lower side in the drawing similarly to each of the above-described examples, but they are omitted for the purpose of simplification of illustration.

Although as the above-described input side tapered IDT electrode 12 and output side tapered IDT electrode 13, two of the electrode fingers 15 are disposed alternately as a pair to be the SPLIT electrode, the single electrode finger 15 may be disposed alternately to be a single electrode.

Note that an example where a set of the input side tapered IDT electrode 12 and the output side tapered IDT electrode 13 is formed in a pair on the piezoelectric substrate 11 is shown in the above examples, but two pairs or more may be formed.

Further, each of the elastic wave filters described above may use not a surface acoustic wave but an elastic wave propagating in an inside of the piezoelectric substrate 11 rather than a surface layer thereof.

Further, in each of the above-described examples, the electrode fingers of the grating reflector are formed in a region between the input side IDT electrode and the output side IDT electrode in such a manner that they extend from an extension region of the bus bars 12a and 13a toward an extension region of the bus bars 12b and 13b and they have a length long enough to cover an entire region between these extension regions, that is, the electrode fingers of the grating reflector are provided covering an entire opening portion between the input side IDT electrode and the output side IDT electrode. However, it is also acceptable that the electrode fingers of the grating reflector are not formed on the entire opening portion as described above but are formed in such a manner that they have a length long enough to cover some of the region between the extension regions.

(Evaluation Test)

Frequency characteristics in the elastic wave filter 10 in the already-described embodiment and the elastic wave filter 100 explained in the related art are examined respectively. FIGS. 17(a) and 17(b) show a pass characteristic of the SAW filter 10 and a pass characteristic of the elastic wave filter 100 respectively. In respective graphs, high band sides in pass bands are circled to be shown as A and B, and as is obvious by comparing A and B, steepness at the high band side is high in the characteristic of the elastic wave filter 10. Then, in the respective graphs, shape factors (S.F.) are measured to be compared. Here, the S.F. is calculated as a ratio of 30 dB band width to 1 dB band width. As a result, the S.F. of the elastic wave filter 10 is 1.67, and the S.F. of the elastic wave filter 100 is 1.70. This result indicates that the configuration of the elastic wave filter 10 is effective in order to increase steepness of attenuation.

What is claimed is:

1. An elastic wave filter comprising:
    an input side tapered IDT electrode including a pair of bus bars formed to be parallel to each other on a piezoelectric substrate and a group of electrode fingers formed in a comb shape by extending the electrode fingers alternately from each of the paired bus bars respectively, and formed in a manner that a width of the electrode finger and a distance between the electrode fingers are widened from the bus bar on one side toward the bus bar on the other side;
    an output side tapered IDT electrode including a pair of bus bars provided on the piezoelectric substrate to extend in an extending direction of the bus bars in said input side tapered IDT electrode and to be apart from said input side tapered IDT electrode in a propagation direction of an elastic wave and a group of electrode fingers formed in a comb shape by extending the electrode fingers alternately from each of the paired bus bars respectively, and formed in a manner that a width of the electrode finger and a distance between the electrode fingers are widened from the bus bar on one side toward the bus bar on the other side;
    a grating reflector including a pair of bus bars provided on the extensions of the bus bars of the input side tapered IDT electrode and the output side tapered IDT electrode, respectively, as well as an electrode finger extending from an end portion on an input side of one bus bar of said pair to an end portion on an input side of the other bus bar of said pair and an electrode finger extending from an end portion on an output side of the one bus bar to an end portion on an output side of the other bus bar, and further comprising a group of electrode fingers, which are arranged between said input side tapered IDT electrode and said output side tapered IDT electrode along the propagation direction of an elastic wave, and which extend from the one bus bar toward the other bus bar, and wherein
    the grating reflector is provided between the input side tapered IDT electrode and the output side tapered IDT electrode and formed apart thereof such that elastic waves propagating at any position in a length direction of the input side electrode fingers propagate through the elastic wave filter along linear lines,
    when seen in the propagation direction of an elastic wave, the respective electrode fingers composing the groups of electrode fingers in said input side tapered IDT electrode and said output side tapered IDT electrode are formed in a manner that width dimensions thereof are the same one another, and a distance dimension between the adjacent electrode fingers is the same as the width dimension of the electrode finger, and
    when seen in the propagation direction of an elastic wave, the group of electrode fingers in said grating reflector is formed in a manner that width dimensions of the respective electrode fingers composing the group of electrode fingers are the same, and a distance dimension between the adjacent electrode fingers is the same as the width dimension, and the width dimension of the electrode finger and the distance dimension between the electrode fingers are set to be equal to or less than a minimum value or equal to or more than a maximum value of the width dimension of the electrode finger and the distance dimension between the electrode fingers in said input side tapered IDT electrode and said output side tapered IDT electrode.

2. The elastic wave filter according to claim 1, wherein the width dimension of the electrode finger and the distance dimension between the electrode fingers in said grating reflector are constituted to be the same as the minimum value of the width dimension of the electrode finger and the distance dimension between the electrode fingers in said IDT electrodes or to be slightly smaller than the minimum value thereof.

3. The elastic wave filter according to claim 1, wherein the width dimension of the electrode finger and the distance dimension between the electrode fingers in said grating reflector are constituted to be the same as the maximum value of the width dimension of the electrode finger and the distance dimension between the electrode fingers in said IDT electrodes or to be slightly larger than the maximum value thereof.

4. The elastic wave filter according to claim 1, wherein the width dimension of the electrode finger and the distance dimension between the electrode fingers in said grating reflector in a direction perpendicular to the propagation direction of an elastic wave are the same respectively.

5. The elastic wave filter according to claim 1, wherein the width dimension of the electrode finger and the distance dimension between the electrode fingers in said grating reflector are gradually widened when seen in a direction perpendicular to the propagation direction of an elastic wave.

6. The elastic wave filter according to claim 1, wherein the group of electrode fingers in said grating reflector is formed to stride from an extension region of the bus bar on one side to an extension region of the bus bar on the other side in said input side tapered IDT electrode or said output side tapered IDT electrode.

* * * * *